(12) United States Patent
Yokoyama

(10) Patent No.: US 8,810,210 B2
(45) Date of Patent: Aug. 19, 2014

(54) HYBRID WORKING MACHINE

(75) Inventor: Kazuya Yokoyama, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 422 days.

(21) Appl. No.: 13/262,564

(22) PCT Filed: Jun. 26, 2009

(86) PCT No.: PCT/JP2009/002971
§ 371 (c)(1),
(2), (4) Date: Nov. 1, 2011

(87) PCT Pub. No.: WO2010/113223
PCT Pub. Date: Oct. 7, 2010

(65) Prior Publication Data
US 2012/0038327 A1 Feb. 16, 2012

(30) Foreign Application Priority Data
Apr. 1, 2009 (JP) .................. 2009-089382

(51) Int. Cl.
| | | |
|---|---|---|
| H02J 7/00 | (2006.01) | |
| B60K 6/28 | (2007.10) | |
| E02F 9/20 | (2006.01) | |
| G01R 31/02 | (2006.01) | |
| B60W 10/103 | (2012.01) | |
| B60W 30/188 | (2012.01) | |
| B60L 11/00 | (2006.01) | |
| B60L 11/18 | (2006.01) | |
| B60K 6/48 | (2007.10) | |

(52) U.S. Cl.
CPC ............... *B60W 30/188* (2013.01); *B60K 6/28* (2013.01); *Y02T 10/7022* (2013.01); *E02F 9/2075* (2013.01); *Y02T 10/7005* (2013.01); *E02F 9/2091* (2013.01); *G01R 31/028* (2013.01); *B60W 10/103* (2013.01); *B60L 2200/40* (2013.01); *B60L 11/005* (2013.01); *B60L 11/1861* (2013.01); *B60L 2240/547* (2013.01); *Y02T 10/6278* (2013.01); *Y02T 10/7044* (2013.01); *Y02T 10/705* (2013.01); *Y02T 10/6221* (2013.01); *B60Y 2400/114* (2013.01); *E02F 9/2025* (2013.01); *B60K 6/48* (2013.01)
USPC .......................................... 320/166

(58) Field of Classification Search
USPC .......................................... 320/166
See application file for complete search history.

(56) References Cited

U.S. PATENT DOCUMENTS 7,327,203 B2 * 2/2008 Asada ........................... 332/109
7,957,847 B2 * 6/2011 Donaldson et al. ........... 700/298

(Continued)

FOREIGN PATENT DOCUMENTS

EP 1526627 4/2005
JP 2000-013910 1/2000

(Continued)

OTHER PUBLICATIONS

International Search Report & Written Opinion corresponding to International Patent Application No. PCT/JP2009/002971 dated Sep. 15, 2009.

*Primary Examiner* — Arun Williams
(74) *Attorney, Agent, or Firm* — Squire Patton Boggs (US) LLP

(57) ABSTRACT

A motor generator operates as a generator and a motor. A converter switches a discharge state where power is supplied from a capacitor to the motor generator and a charge state where the capacitor is charged by the power generated from the motor generator. Electric power that is output from the capacitor in the discharge state and electric power that is input to the capacitor in the charge state are controlled. A capacitor voltmeter measures a terminal-terminal voltage of the capacitor. A capacitor ammeter measures charge/discharge current of the capacitor. The measurement result is input from the capacitor voltmeter and the capacitor ammeter to a controller. The controller controls the converter based on the measurement result.

16 Claims, 24 Drawing Sheets

(56) References Cited

U.S. PATENT DOCUMENTS

2005/0083017 A1 4/2005 Suzuki
2009/0266630 A1* 10/2009 Soma et al. ............. 180/65.265

FOREIGN PATENT DOCUMENTS

| | | |
|---|---|---|
| JP | 2005-124353 | 5/2005 |
| JP | 2007-155586 | 6/2007 |

* cited by examiner

HYBRID WORKING MACHINE

TECHNICAL FIELD

The present invention relates to a hybrid working machine that performs an output control according to the deterioration state of a capacitor.

BACKGROUND ART

Recently, power generation machines such as construction working machines require performances of reduced fuel consumption, low environmental pollution, low noise, and the like, taking the global environment into consideration. In order to satisfy these requirements, a working machine such as a hydraulic shovel using a motor has appeared as a substitute for or a supplement for the hydraulic pump. In a working machine in which a motor is assembled, surplus kinetic energy that is generated from the motor is converted into electric energy, and the converted electric energy is accumulated in a capacitor or the like.

The capacitor is deteriorated due to long-term use, in which charging and discharging are repeated, or due to overcharging, excessive discharging, heat generation and the like. By measuring the internal resistance of the capacitor, its deterioration state can be determined (Japanese Unexamined Patent Publication No. 2007-155586).

DISCLOSURE OF INVENTION

Regardless of the deterioration of the capacitor, if a normal operation continues, the deterioration is expedited to shorten the lifespan of the capacitor.

According to one aspect of the present invention, there is provided a hybrid working machine which includes
a capacitor;
a motor generator operating as an electric generator and an electric motor;
a converter capable of controlling electric power that is output from the capacitor in a discharge state and electric power that is input to the capacitor in a charge state by switching the discharge state where power is supplied from the capacitor to the motor generator and the charge state where the capacitor is charged by the power generated from the motor generator;
a capacitor voltmeter measuring a terminal-terminal voltage of the capacitor;
a capacitor ammeter measuring charge/discharge current of the capacitor;
and a controller receiving a measurement result from the capacitor voltmeter and the capacitor ammeter, determining an appropriate range of input/output power of the capacitor based on the measurement result, and controlling the converter so that the input/output power of the capacitor does not depart from the appropriate range.

From the measurement result by the capacitor voltmeter and the capacitor ammeter, the deterioration state of the capacitor can be assumed. Since the input/output power of the capacitor is in an appropriate range based on the measurement result, the deterioration of the capacitor can be suppressed.

BEST MODE FOR CARRYING OUT THE INVENTION

Hereinafter, embodiments will be described with reference to the accompanying drawings.

Embodiment 1

Figure 1:
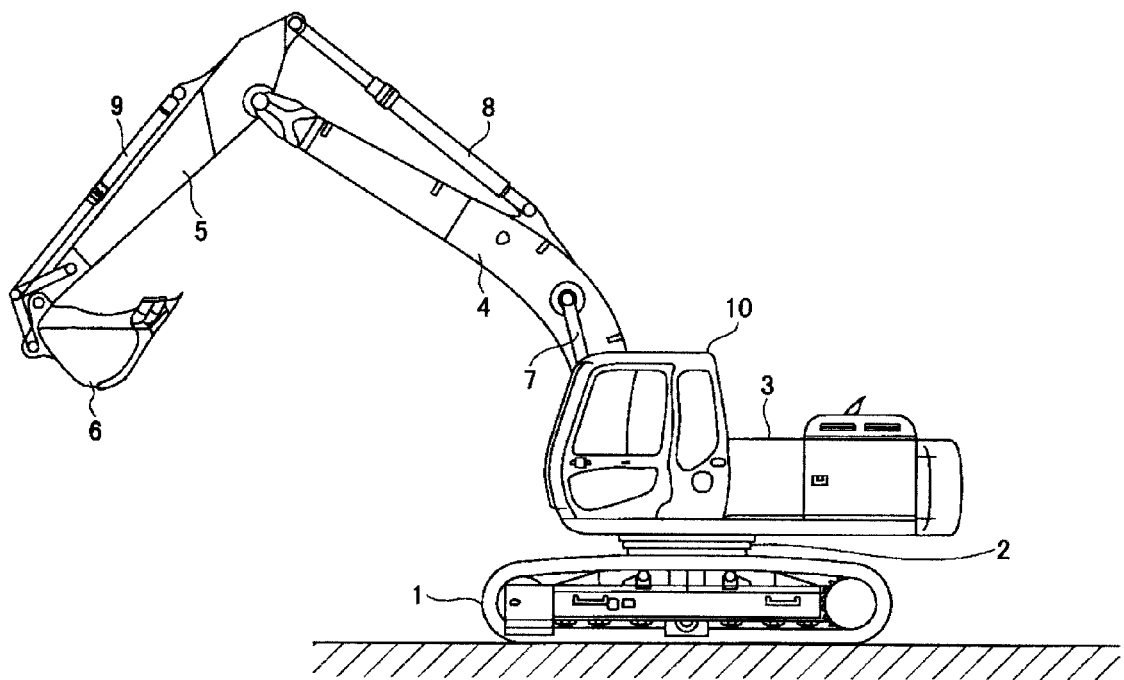
FIG. 1 is a side view of a hybrid working machine according to an embodiment.

FIG. 1 is a side view of a hybrid working machine according to embodiment 1. An upper swing structure 3 is mounted on a lower driving structure (base body) 1 through a swing mechanism 2. The swing mechanism 2 includes a motor, and swings the upper swing structure 3 clockwise or counterclockwise. A boom 4 is attached to the upper swing structure 3. The boom 4 moves in upward and downward directions against the upper swing structure 3 by a boom cylinder 7 that is hydraulically driven. An arm 5 is attached to the front end of the boom 4. The arm 5 moves in forward and backward directions against the boom 4 by an arm cylinder 8 that is hydraulically driven. A bucket 6 is attached to the front end of the arm 5. The bucket 6 moves in upward and downward directions against the arm 5 by a bucket cylinder 9 that is hydraulically driven. A cabin 10 for accommodating an operator is further mounted on the upper swing structure 3.

Figure 2:
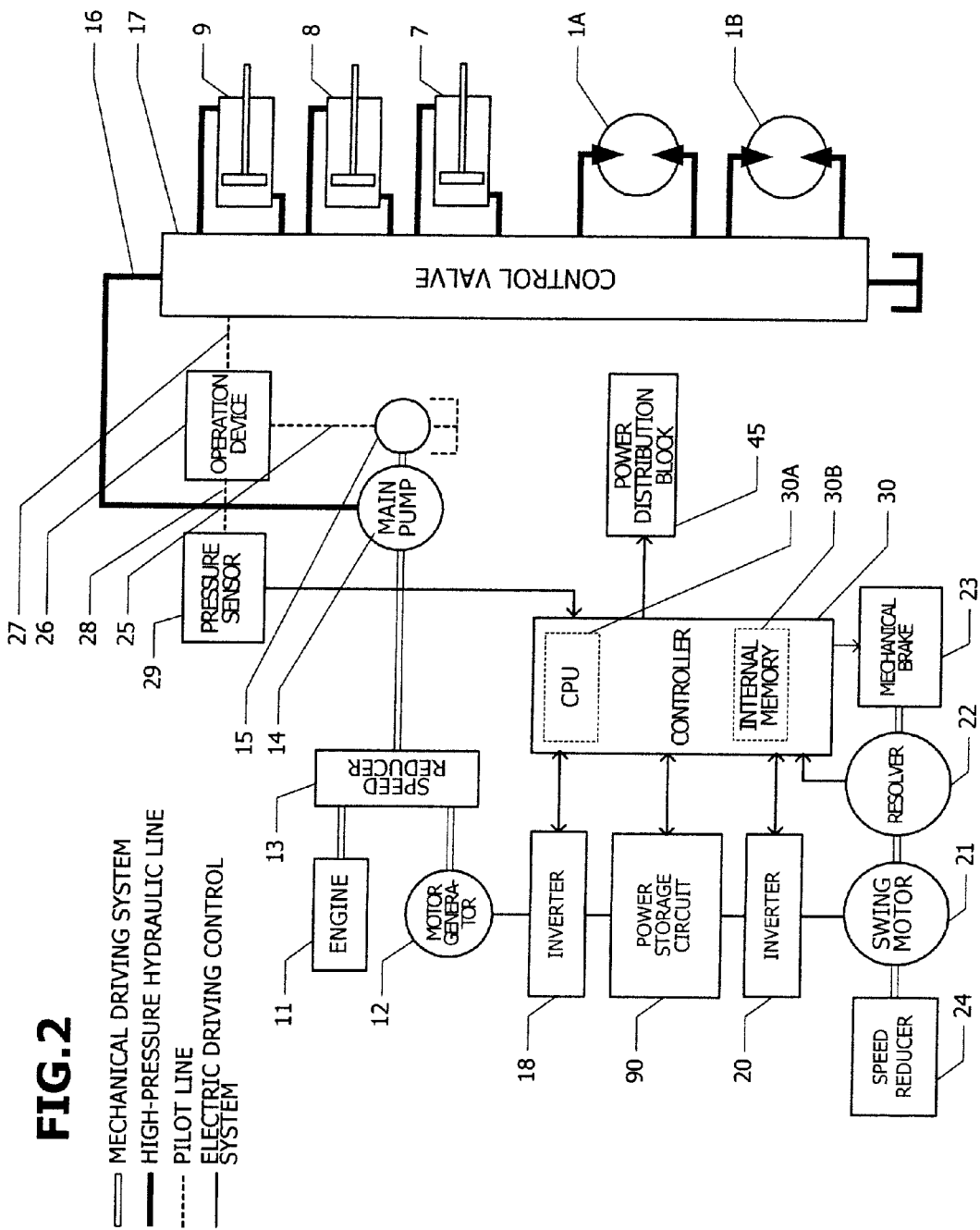
FIG. 2 is a block diagram of a hybrid working machine according to an embodiment.

FIG. 2 is a block diagram of a hybrid working machine. In FIG. 2, a mechanical power system is indicated by dual lines, a high-pressure hydraulic line is indicated by a thick solid line, an electrical system is indicated b a thin solid line, and a pilot line is indicated by a dashed line.

A driving shaft of an engine 11 is connected to an input shaft of a speed reducer 13. As an engine 11, an engine that generates a driving force by fuel except for electricity, for example, an internal combustion engine such as a diesel engine or the like may be used. The engine 11 is full time driven during the operation of the working machine.

A driving shaft of a motor generator 12 is coupled to another input side of the speed reducer 13. The motor generator 12 can perform both operations of a motor (assist) operation and a generator operation. The motor generator 12, for example, may use an internal permanent magnet (IPM) motor in which a magnet is buried inside a rotor.

A speed reducer 13 has two input shafts and one output shaft. To this output shaft, a driving shaft of a main pump 14 is coupled.

If load that is applied to the engine 11 is large, the motor generator 12 performs an assist operation, and the driving force of the motor generator 12 is transmitted to the main pump 14 through the speed reducer 13. Accordingly, the load that is applied to the engine 11 is reduced. On the other hand, if the load that is applied to the engine 11 is small, the driving force of the engine 11 is transmitted to the motor generator 12 through the speed reducer 13, and thus the motor generator 12 performs the generator operation. The switchover between the assist operation and the generator operation of the motor generator 12 is performed by an inverter 18 connected to the motor generator 12. The inverter 18 is controlled by a controller 30.

The controller 30 includes a central processing unit (CPU) 30A and an internal memory 30B. The CPU 30A executes a drive control program that is stored in the internal memory 30B. The controller 30 displays the deterioration states of various kinds of devices on a display device 45 to arouse a user's attention.

The main pump 14 supplies hydraulic pressure to a control valve 17 through a high-pressure hydraulic line 16. The control valve 17 distributes the hydraulic pressure to hydraulic motors 1A and 1B, the boom cylinder 7, the arm cylinder 8, and the bucket cylinder 9 in accordance with an operator's command. The hydraulic motors 1A and 1B drive two left and right crawlers provided on the lower driving structure 1 illustrated in FIG. 1.

The input/output terminals of the electrical system of the motor generator 12 are connected to a electric storage circuit 90 through the inverter 18. The electric storage circuit 90 is further connected to a swing motor (load motor) 21 through another inverter 20. The electric storage circuit 90 and the inverter 20 are controlled by the controller 30.

In a period when the motor generator 12 performs an assist operation, necessary electric power is supplied from the electric storage circuit 90 to the motor generator 12, and thus the motor generator 12 outputs mechanical power. In a period when the motor generator 12 performs a generator operation, necessary mechanical power is supplied from the engine 11, and thus the motor generator 12 outputs electrical power. The power generated by the motor generator 12 is supplied to the electric storage circuit 90. The inverter 18 receives the command from the controller 30, and performs operation control of the motor generator 12 so that motor generator 12 outputs the commanded mechanical power or electrical power.

The swing motor 21 is AC-driven by a pulse width modulation (PWM) control signal from the inverter 20 to perform both a power running operation that outputs mechanical power and a regenerative operation that outputs electrical power. The inverter 20 receives the command from the controller 30, and performs operation control of the swing motor 21 so as to output the commanded mechanical power. As the swing motor 21, for example, an IPM motor is used. The IPM motor generates a large induced electromotive force during the regenerative operation.

During the power running operation of the swing motor 21, the rotating force of the swing motor 21 is transmitted to the swing mechanism 2 illustrated in FIG. 1 through the speed reducer 24. At this time, the speed reducer 24 reduces the rotating speed. Accordingly, the rotating force that is generated from the swing motor 21 is increased, and is transmitted to the swing mechanism 2. Further, during the regenerative operation, the rotational motion of the upper swing structure 3 is transmitted to the swing motor 21 through the speed reducer 24, and thus the swing motor 21 generates the regenerative power. At this time, the speed reducer 24, unlike the power running operation, heightens the rotating speed. Accordingly, the revolution speed of the swing motor 21 can be increased.

A resolver 22 detects the position with respect to the rotating direction of the rotating shaft of the swing motor 21. The result of detection is input to the controller 30. By detecting the position with respect to the rotating direction of the rotating shaft before and after the operation of the swing motor 21, the swing angle and the swing direction is derived.

A mechanical brake 23 is coupled to the rotating shaft of the swing motor 21, and generates a mechanical braking force. The braking state and the releasing state of the mechanical brake 23 are switched over by an electromagnetic switch under the control of the controller 30.

A pilot pump 15 generates pilot pressure that is required in the hydraulic operation system. The generated pilot pressure is supplied to an operation device 26 through a pilot line 25. The operation device 26 includes levers and pedals, and is operated by an operator. The operation device 26 converts the primary hydraulic pressure that is supplied from the pilot line 25 into the secondary hydraulic pressure according to the operator's operation. The secondary hydraulic pressure is transmitted to the control valve 17 through a hydraulic line 27 and is transmitted to a pressure sensor 29 through another hydraulic line 28.

The detection result of the pressure that is detected by the pressure sensor 29 is input to the controller 30. Accordingly, the controller 30 can detect the operational situations of the lower driving structure 1, the swing mechanism 2, the boom 4, the arm 5, and the bucket 6. Particularly, in the hybrid working machine according to the embodiment 1, the swing motor 21 drives the swing mechanism 2, and thus it is required to detect the operation amount of the lever for controlling the swing mechanism 2 at high precision. The controller 30 can detect the operation amount of the lever at high precision through the pressure sensor 29.

Further, the controller 30 can detect a state where neither of the lower driving structure 1, the swing mechanism 2, the boom 4, the arm 5, and the bucket 6 operates and neither of the power supply to the electric storage circuit 90 and the compulsory extraction of the power from the electric storage circuit 90 is performed (non-operation state).

Figure 3:
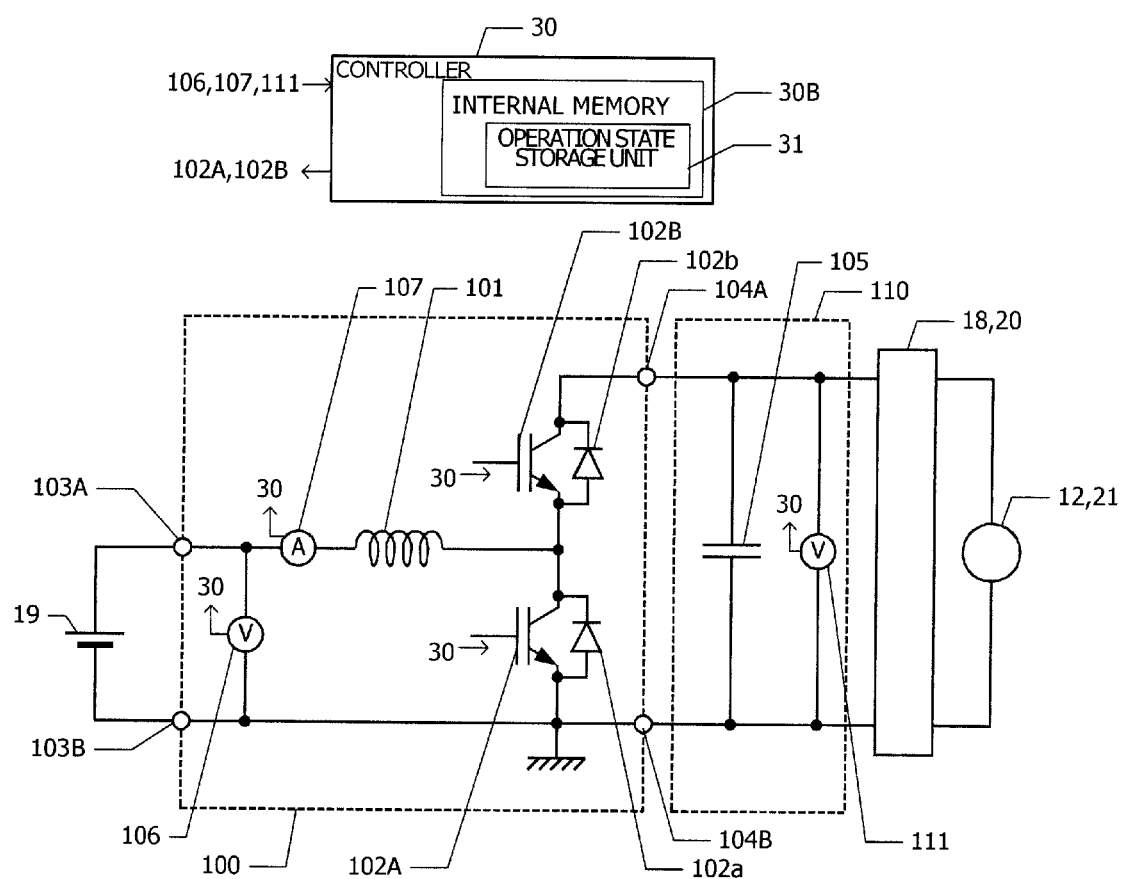
FIG. 3 is an equivalent circuit diagram of a electric storage circuit that is mounted on a hybrid working machine according to an embodiment.

FIG. 3 illustrates an equivalent circuit diagram of the electric storage circuit 90. The electric storage circuit 90 includes a capacitor 19, a converter 100, and a DC bus line 110. The capacitor 19 is connected to a pair of power connection terminals 103A and 103B of the converter 100, and the DC bus line 110 is connected to a pair of output terminals 104A and 104B. One power connection terminal 103B and one output terminal 104B are grounded.

The DC bus line 110 is connected to the motor generator 12 and the swing motor 21 through inverters 18 and 20, respectively. The DC bus line 110 includes a ground line connected to one output terminal 104B and a power line connected to the other output terminal 104A. A smoothing condenser 105 is inserted between the ground line and the power line. The voltage that is generated on the DC bus line 110 is measured by a DC bus voltmeter 111, and the result of measurement is input to the controller 30.

A serial circuit, in which collector of a boost insulating gate bipolar transistor (IGBT) 102A and an emitter of a buck IGBT 102B are connected together, is connected between the output terminals 104A and 104B. The emitter of the boost IGBT 102A is grounded, and the collector of the buck IGBT 102B is connected to the output terminal 104A on the high-voltage side. The mutual connection point of the boost IGBT 102A and the buck IGBT 102B is connected to a power connection terminal 103A on the high-voltage side through a reactor 101.

Diodes 102a and 102b are connected in parallel to the boost IGBT 102A and the buck IGBT 102B in a direction where a direction from the emitter to the collector is a forward direction.

The voltmeter 106 connected between the power connection terminals 103A and 103B measures the terminal-terminal voltage of the capacitor 19. The ammeter 107 inserted in series into the reactor 101 measures the charge/discharge current of the capacitor 19. The results of measurements of the voltage and current are input to the controller 30.

The controller 30 applies a pulse width modulation (PWM) voltage for control to the gate electrodes of the boost IGBT 102A and the buck IGBT 102B. Further, in the internal memory 30B of the controller 30, an operation state storage region 31 is secured. The current operation state is stored in the operation state storage region 31. The operation state, as described later, is any one of two states, "normal operation state" and "output limiting state".

Hereinafter, a boost operation (discharge operation) will be described. A PWM voltage is applied to the gate electrode of the boost IGBT 102A. When the boost IGBT 102A is changed to off-state, an induced electromotive force, in a direction where current flows from the power connection terminal 103A on the high-voltage side to the collector of the boost IGBT 102A, is generated in the reactor 101. This electromotive force is applied to the DC bus line 110 through the diode 102b. Accordingly, the DC bus line 110 is boosted.

Next, the buck operation (charging operation) will be described. A PWM voltage is applied to the gate electrode of the buck IGBT 102B. When the buck IGBT 102B is changed to off-state, an induced electromotive force, in a direction where current flows from the emitter of the buck IGBT 102B to the power connection terminal 103A on the high-voltage side, is generated in the reactor 101. By this electromotive force, the capacitor 19 is charged. In this specification, it is assumed that the current in the direction where the capacitor 19 is discharged is defined as positive, and the current in the direction where the capacitor 19 is charged is defined as negative.

Figure 4:
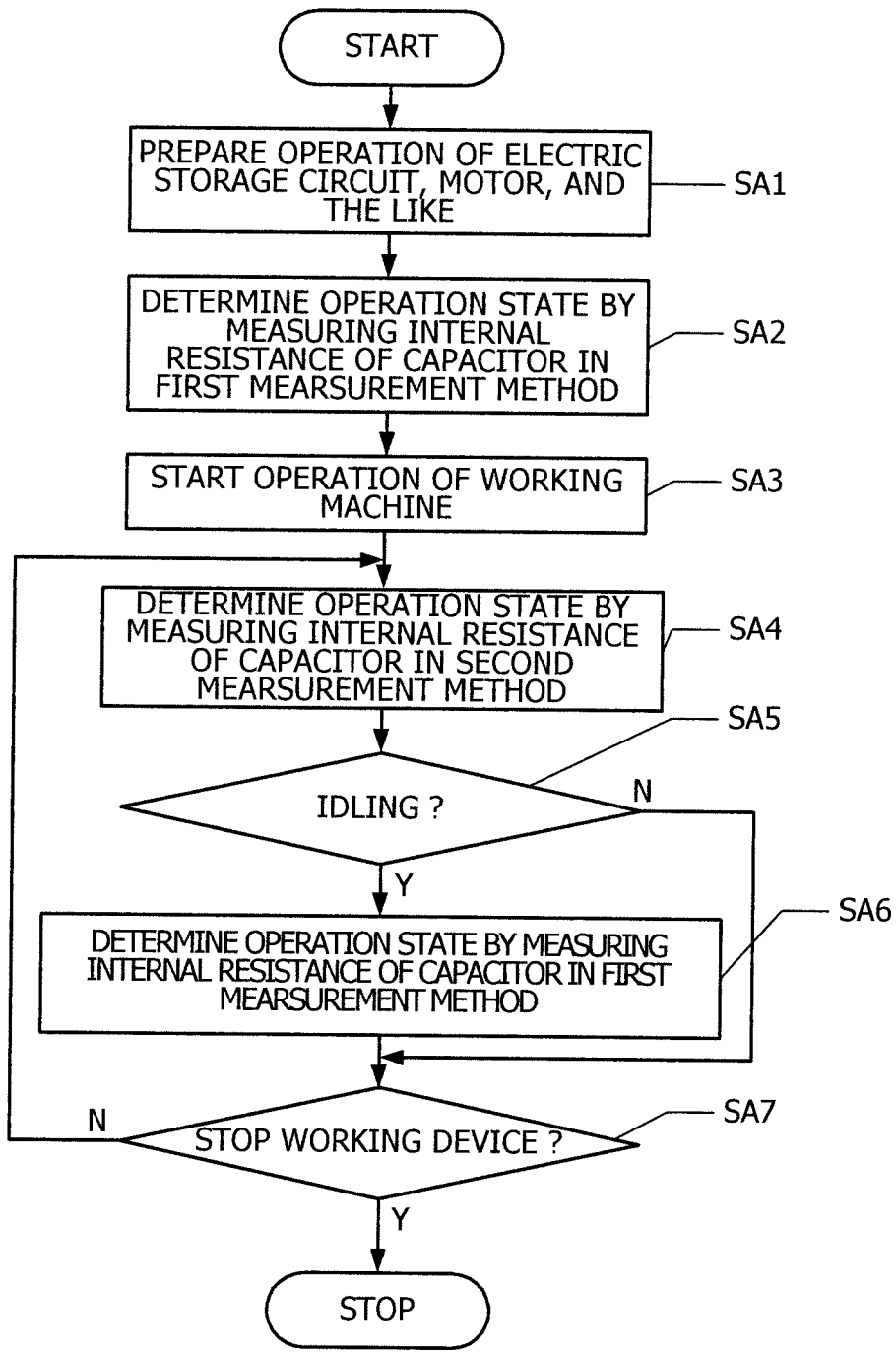
FIG. 4 is a diagram illustrating a flow from the starting to the stopping of a hybrid working machine according to an embodiment.

FIG. 4 illustrates a series of processes from the starting to the stopping of the working machine according to the embodiment 1. If the working machine starts when an operator turns on a start switch of the working machine, in step SA1, the operation preparation of the electric storage circuit 90 and the motor generator 12 is performed. Specifically, the engine 11 is driven, and the motor generator 12 starts to rotate. Accordingly, the motor generator 12 starts to generate electricity, and the smoothing condenser 105 of the DC bus line 110 is charged.

If the operation preparation is completed, in step SA2, the controller 30 decides the operation state by measuring the internal resistance of the capacitor 19 in a first measurement method. The first measurement method will be described later with reference to FIG. 5. Thereafter, in step SA3, by inputting an operation command, the working machine starts its operation. The operator inputs the operation command by operating the operation device 26 (FIG. 2).

During the operation of the working machine, in step SA4, the controller 30 decides the operation state by measuring the internal resistance of the capacitor in a second measurement method. The second measurement method will be described later with reference to FIG. 8.

In step SA5, the controller 30 determines whether or not the working machine is in an idling state, and if it is determined that the working machine is in an idling state, in step SA6, the controller 30 decides the operation state by measuring the internal resistance of the capacitor in the first measurement method. Thereafter, in step SA7, the controller 30 determines whether or not a command for stopping the working machine is input. The operator inputs the stop command of the working machine by operating the operation device 26 (FIG. 2). In step SA5, if it is determined that the working machine is not in an idling state, the process in step SA6 is not performed, but in step SA7, it is determined whether or not the command for stopping the working machine is input.

If the command for stopping the working machine is input, the controller 30 stops the working machine. If the command for stopping the working machine is not input, the controller 30 returns the process to step SA4, and performs measurement of the internal resistance of the capacitor in the second measurement method and deciding of the operation state.

Figure 5:
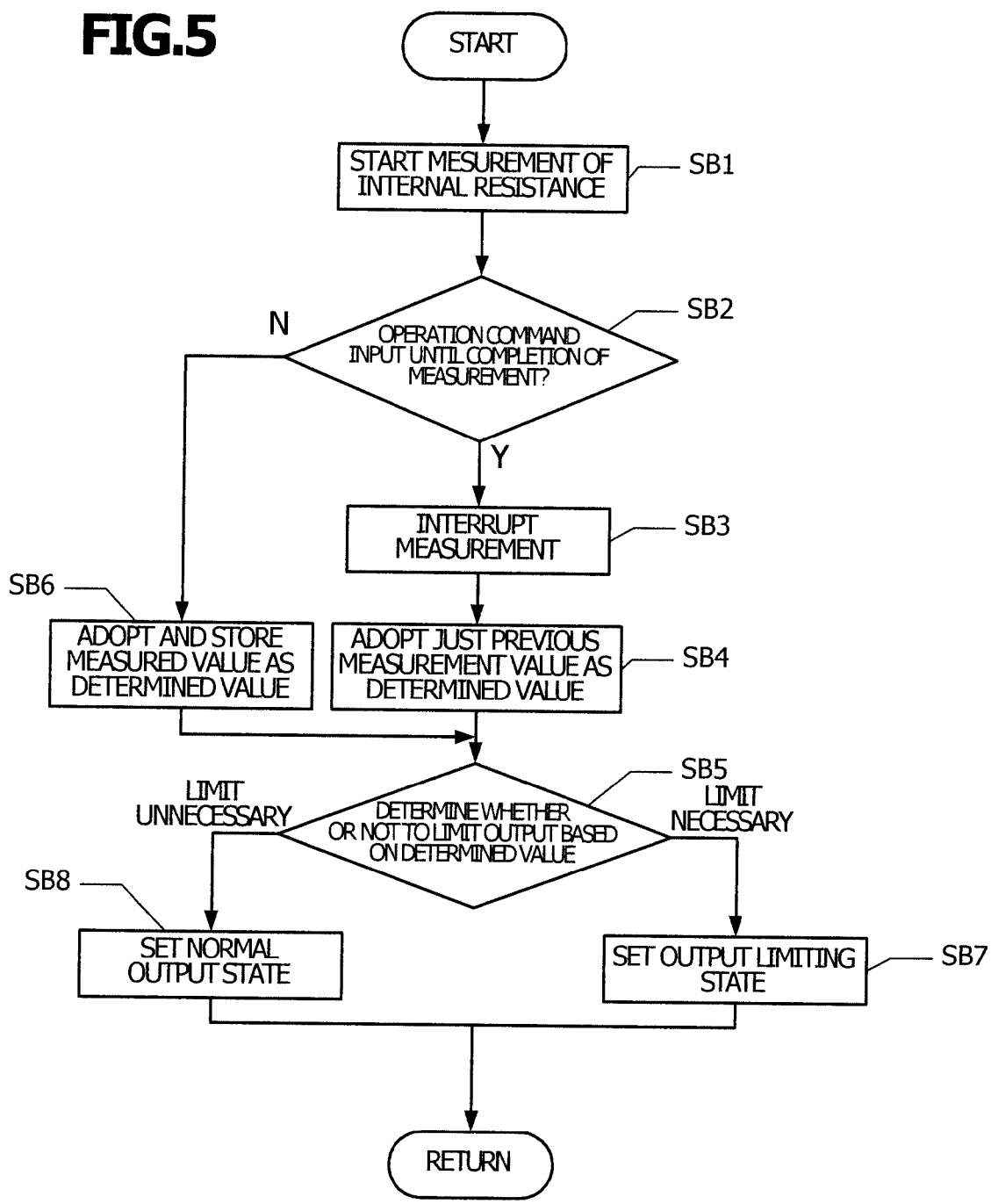
FIG. 5 is a flowchart illustrating the determination of an operation state through measurement of internal resistance of a capacitor in a first measurement method.

FIG. 5 is a flowchart of the first measurement method. First, in step SB1, the controller 30 starts the measurement of the internal resistance of the capacitor 19. The measurement method will be described later with reference to FIGS. 6 and 7.

In step SB2, up to the completion of the measurement, the controller 30 determines whether or not the operation command is input. If the operation command is input during the measurement, the controller 30 interrupts the measurement in step SB3. Thereafter, in step SB4, the controller 30 adopts the measured value that is obtained in the just previous measurement process as the decision value. Thereafter, in step SB5, the controller 30 determines necessity of output limiting based on the decision value.

In step SB2, if the operation command is not input up to the completion of the measurement, in step SB6, the controller 30 adopts and stores the measured value as the decision value. Thereafter, in step SB5, the controller 30 determines necessity of output limiting based on the decision value.

In step SB5, for example, the decision value is compared with a reference value. If the decision value is equal to or smaller than the reference value, it is determined that the output limiting is not necessary. If the decision value exceeds the reference value, it is considered that the capacitor 19 is deteriorated. In this case, it is determined that the output limiting is necessary.

If it is determined that the output limiting is necessary, in step SB7, the controller 30 sets the "output limiting state" in the operation state storage region 31 (FIG. 3). If it is determined that the output limiting is not necessary, in step SB8, the controller 30 sets the "normal output state" in the operation state storage region 31. The details of the normal operation state and the output limiting state will be described later with reference to FIGS. 10A and 10B.

Next, the internal resistance measurement method will be described.

Figure 6:
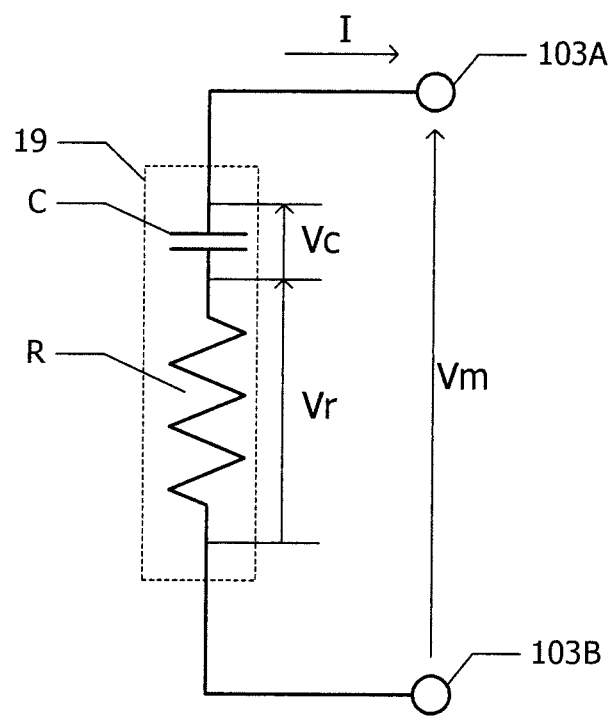
FIG. 6 is an equivalent circuit diagram of a capacitor.

FIG. 6 is an equivalent circuit diagram of the capacitor 19. The capacitor 19 may be indicated as a capacitance C and the internal resistance R which are connected in series. The terminal-terminal voltage Vm of the capacitor 19 is represented by the sum of the voltage Vc that is generated across the capacitance C and the voltage drop Vr generated by the internal resistance R. If the charge/discharge current of the capacitor 19 is represented by "I", the voltage drop Vr is expressed by Vr=R×I because the direction of the discharge current is defined as positive.

The terminal-terminal voltage Vm is measured by the capacitor voltmeter 106 illustrated in FIG. 3, and the current I is measured by the capacitor ammeter 107 illustrated in FIG. 3.

Figure 7:
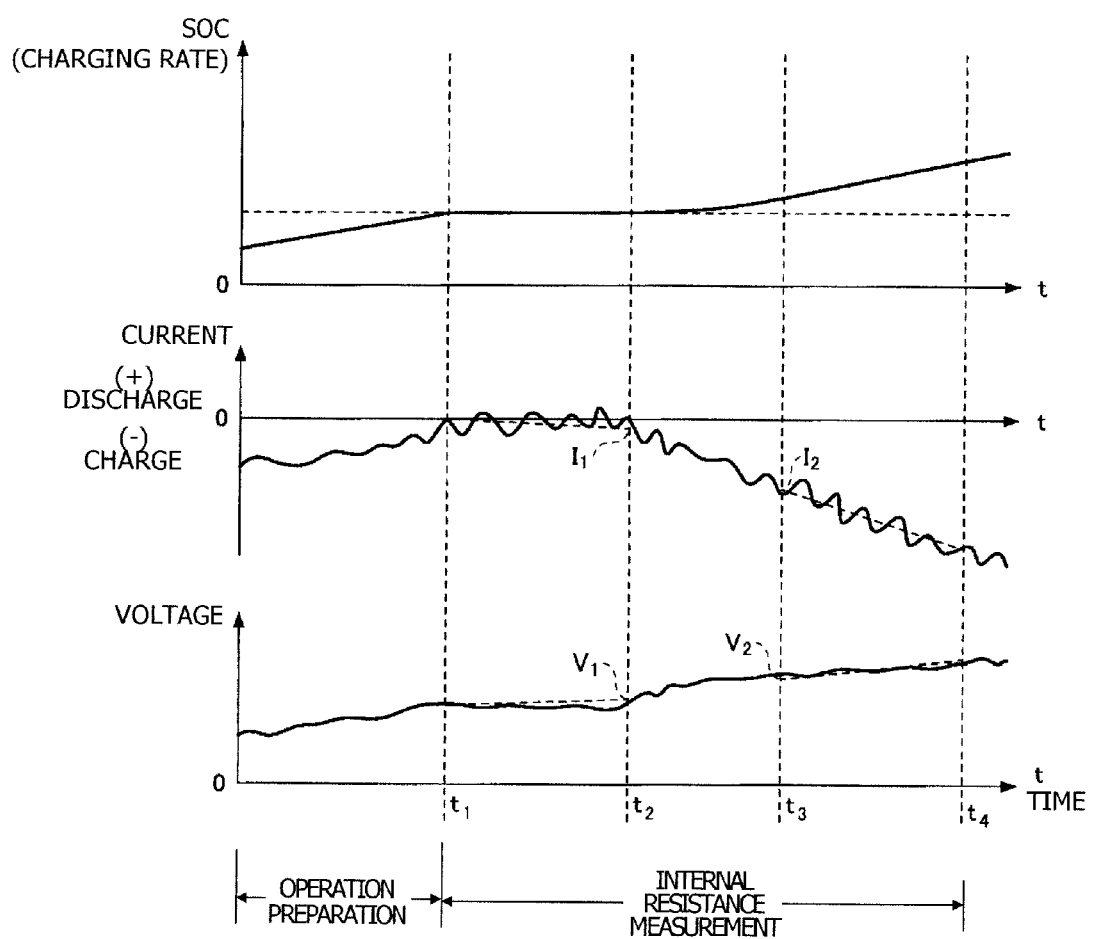
FIG. 7 is a graph illustrating the temporal change in a charge rate, charge/discharge current, and terminal-terminal voltage when the internal resistance of the capacitor is measured in the first measurement method.

FIG. 7 is a graph illustrating the temporal change in the charge rate SOC of the capacitance C, current I, and voltage Vm. The period of time 0 to $t_1$, for example, corresponds to an operation preparation period of step SA1 illustrated in FIG. 4, and the current I is negative. That is, charging of the capacitor 19 is performed. Because of this, the charge rate SOC is gradually increased. The period of time $t_1$ to $t_4$, for example, corresponds to an internal resistance measurement period of step SA2 illustrated in FIG. 4.

In the period of time $t_1$ to $t_2$, the current I becomes almost 0. That is, charging of the capacitor 19 is not performed, and also discharging of the capacitor 19 is not performed. At this time, the working machine is in a non-operation state, and the engine 11 is in an idling state in which the engine 11 maintains a constant revolution. Further, the terminal-terminal voltage Vm and the charge rate SOC of the capacitor 19 are almost constant. The time when the operation preparation of the electric storage circuit and the motor is completed in step SA1 illustrated in FIG. 4 corresponds to the period of time $t_1$ to $t_2$. Further, the period, in which the engine 11 is determined to be in an idling state in step SA5, corresponds to the period of time $t_1$ to $t_2$.

At time $t_2$, the revolutions of the engine 11 is maintained constant, the motor generator 12 is in a generation state, and the converter 100 is in a charge state. At time $t_2$ or just thereafter, the current I and the voltage Vm are measured. The current measurement result at time $t_2$ is represented by "$I_1$", and the voltage measurement result is represented by "$V_1$".

A standby state is maintained until the charging operation of the converter 100 becomes stable. If the current reaches a predetermined value, it is determined that the current is stabilized. The time when the current becomes stabilized is represented by "$t_3$". At time $t_3$ or just thereafter, the current I and the voltage Vm are measured. The current measurement result is represented by "$I_2$", and the voltage measurement result is represented by "$V_2$".

In the period of time $t_3$ to $t_4$, the charge current is monotonously increased, and the charge rate SOC rises. The time from $t_2$ to $t_3$ and the time from $t_3$ to $t_4$ may be actually several tens of milliseconds and several tens to several hundred milliseconds, respectively.

If the increase amount of the accumulated charge amount of the capacitor 19 from time $t_2$ to $t_3$ is represented by "ΔQ", the internal resistance R is expressed as in the following equation.

$$R = -\frac{V_2 - V_1}{I_2 - I_1} + \frac{\Delta Q}{C(I_2 - I_1)} \quad (1)$$

Since the standby time from $t_2$ to $t_3$ is sufficiently short, and the capacitance C is sufficiently large, the second term of the right side of the above equation can be approximated by almost 0. Accordingly, the internal resistance R can be calculated from the measured values of voltage and current. At this time, as the current $I_1$ and voltage $V_1$, average values of current and voltage in the period of time $t_1$ to $t_2$ may be adopted, and as the current $I_2$ and voltage $V_2$, average values of current and voltage in the period of time $t_3$ to $t_4$ may be adopted.

Figure 8:
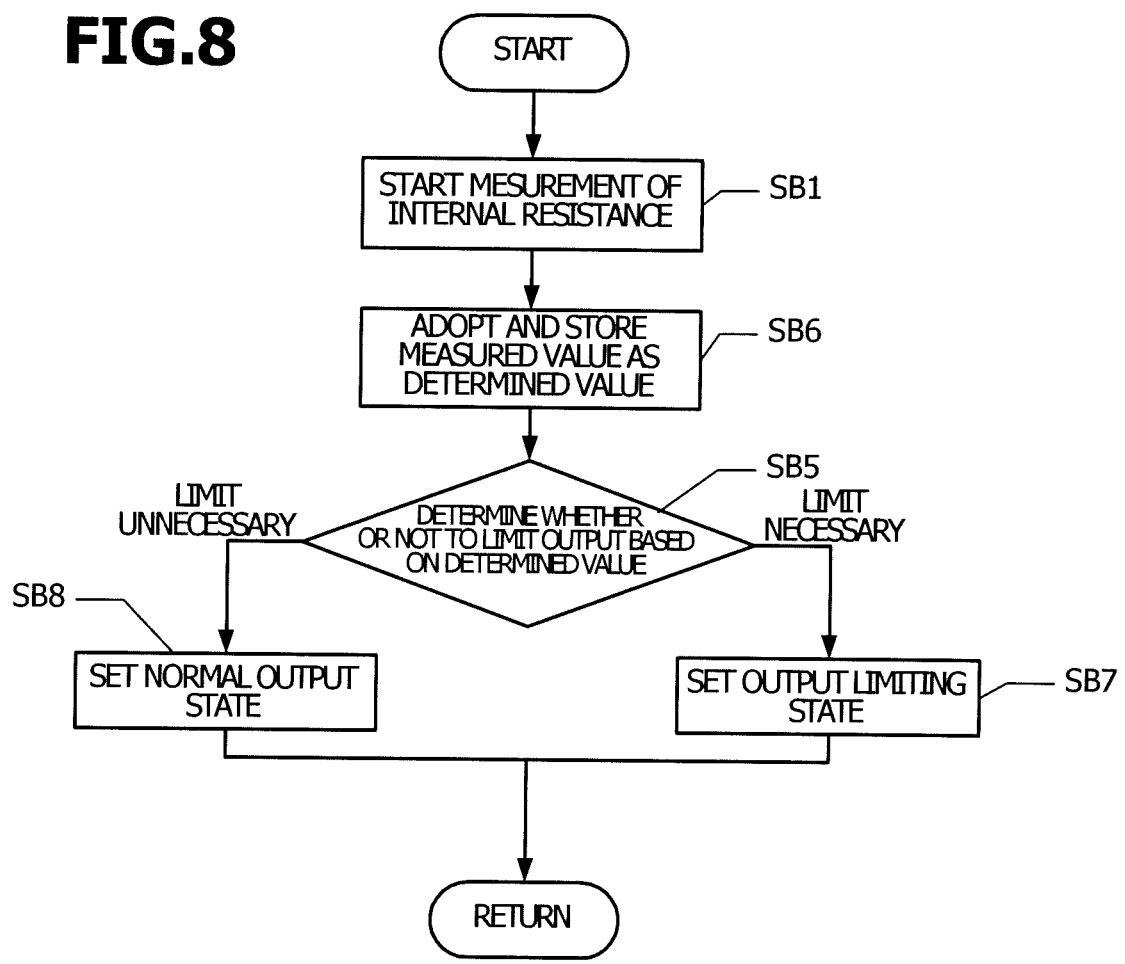
FIG. 8 is a flowchart illustrating the determination of an operation state through measurement of internal resistance of a capacitor in a second measurement method.

FIG. 8 is a flowchart of the second measurement method. In the second measurement method, steps SB2 to SB4 of the first measurement method illustrated in FIG. 5 are omitted. In step SB1, the internal resistance is measured, and then, in step SB6, the measured value is adopted as the decision value. Thereafter, in step SB5, necessity of the output limiting is determined based on the decision value. Steps SB7 and SB8 are the same as those according to the first measurement method.

Figure 9:
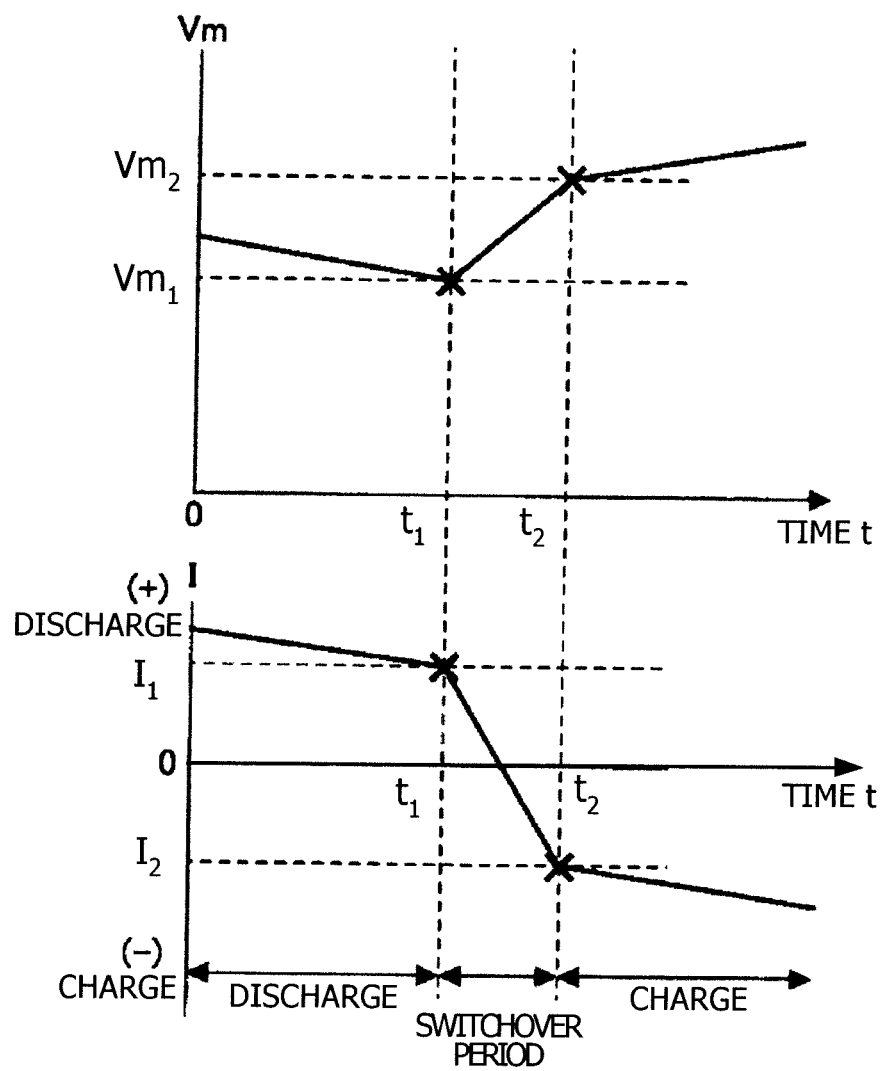
FIG. 9 is a graph illustrating the temporal change in terminal-terminal voltage and charge/discharge current when the internal resistance of the capacitor is measured in the second measurement method.

Next, referring to FIG. 9, the internal resistance measurement method in step SB1 will be described. Upper and lower drawings of FIG. 9 show examples of temporal change in the terminal-terminal voltage Vm and the charge/discharge current I of the capacitor 19, respectively.

In the period of time 0 to $t_1$, the discharge current I is gradually decreased, and the terminal-terminal voltage Vm is gradually lowered. Between the time $t_1$ and $t_2$, the discharge state is switched over to the charge state. After time $t_2$, the charge current is gradually increased (the current I is negative, and its absolute value is gradually increased). The discharge current at time $t_1$ is represented by "$I_1$", and the terminal-terminal voltage is represented by "$Vm_1$". The charge current at time $t_2$ is represented by "$I_2$"(<0), and the terminal-terminal voltage is represented by "$Vm_2$". Further, in the equivalent circuit illustrated in FIG. 6, if the capacitor voltages Vc at time $t_1$ and $t_2$ are represented by "$V_{C1}$" and "$V_{C2}$", respectively, the following equation is established.

$$Vm_1 = Vc_1 - RI_1$$

$$Vm_2 = Vc_2 - RI_2 \qquad (2)$$

The time from $t_1$ to $t_2$, for example, is about several milliseconds. Further, the capacitance C, for example, is sufficiently large to be about 10 F. Accordingly, the voltage Vc that is generated across the capacitance C is scarcely changed between time from $t_1$ to $t_2$. As an example, the difference between $V_{C1}$ and $V_{C2}$ is about 0.01 to 0.1% of $V_{C1}$. Accordingly, $V_{C1}$ can be approximated by $V_{C1} = V_{C2}$. Then, the following equation is obtained from the above-described equation.

$$R = -\frac{Vm_2 - Vm_1}{I_2 - I_1}$$

By measuring the terminal-terminal voltage $Vm_1$ and the charge/discharge current $I_1$ at time $t_1$ and the terminal-terminal voltage $Vm_2$ and the charge/discharge current $I_2$ at time $t_2$, the internal resistance R of the capacitor 19 can be calculated. The terminal-terminal voltage Vm and the charge/discharge current I can be measured by the capacitor voltmeter 106 and the capacitor ammeter 107 illustrated in FIG. 3.

In this case, the measurement time of the internal resistance is not limited to the time when the discharge state is switched over to the charge state. The internal resistance may be measured when the charge state is switched over to the discharge state. Further, instead of the switchover time of the charge state and the discharge state, the measurement may be performed in a short time when the approximate expression $V_{C1} = V_{C2}$ is realized. At this time, in order to reduce the calculation error of the internal resistance, it is preferable to perform the measurement in a period when the change width of the voltage Vc across the capacitance C is small and change width of the current I is large. Since large current change can be expected during the switchover between the charge state and the discharge state, the measurement error becomes smaller.

In FIG. 4, the measurement of the internal resistance by the first measurement method and the measurement of the internal resistance by the second measurement method are used in combination. However, only one of the measurement methods may be adopted. In the case of adopting one measurement method, it is preferable to adopt the first measurement method that performs the measurement in a period when the current is stabilized.

Next, referring to FIGS. 10A and 10B, a normal operation state and an output limiting state will be described.

Figure 10A:
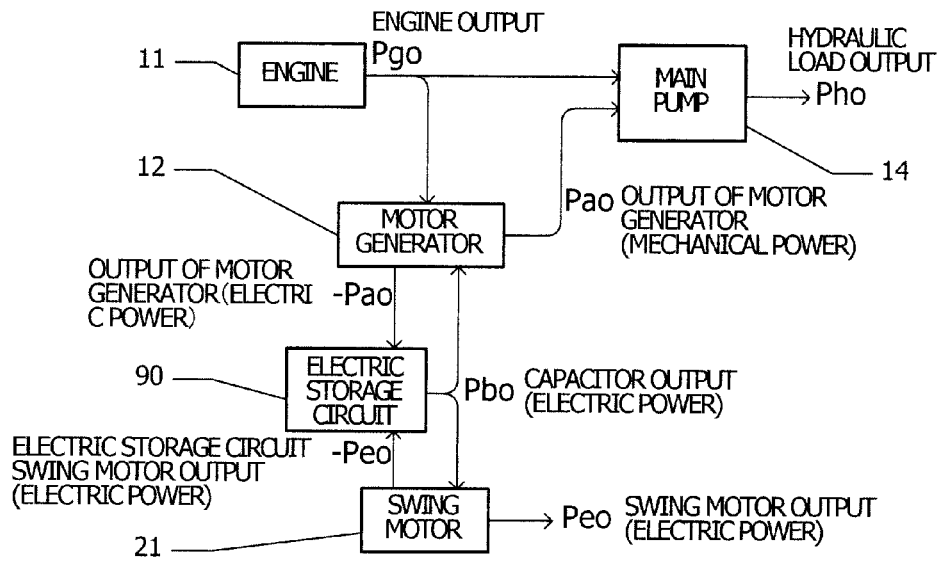
FIG. 10A is a simple block diagram of a hybrid working machine according to an embodiment.

FIG. 10A shows a simple block diagram of a hybrid working machine according to embodiment 1, and flow of mechanical and electrical powers. The output Pgo from the engine 11 is supplied to the main pump 14 and the motor generator 12. When the motor generator 12 is in an assist operation state, the motor generator output (mechanical power) Pao is supplied from the motor generator 12 to the main pump 14. When the motor generator 12 is in a generation operation state, the generated motor generator output (electrical power) −Pao is input to the electric storage circuit 90. Here, it is defined that the output when the motor generator 12 is in an assist operation state is positive, and the output when the motor generator 12 is in a generation operation state is negative.

The capacitor output Pbo from the electric storage circuit 90 is supplied to the motor generator 12 and the swing motor 21. The swing motor 21 outputs a swing motor output (mechanical power) Peo when it is in a power running state, and outputs a swing motor output (electrical power) −Peo to the electric storage circuit 90 when it is in a regenerative operation state. Here, it is defined that the output during the power running operation is positive and the output during the regenerative operation is negative.

Figure 10B:
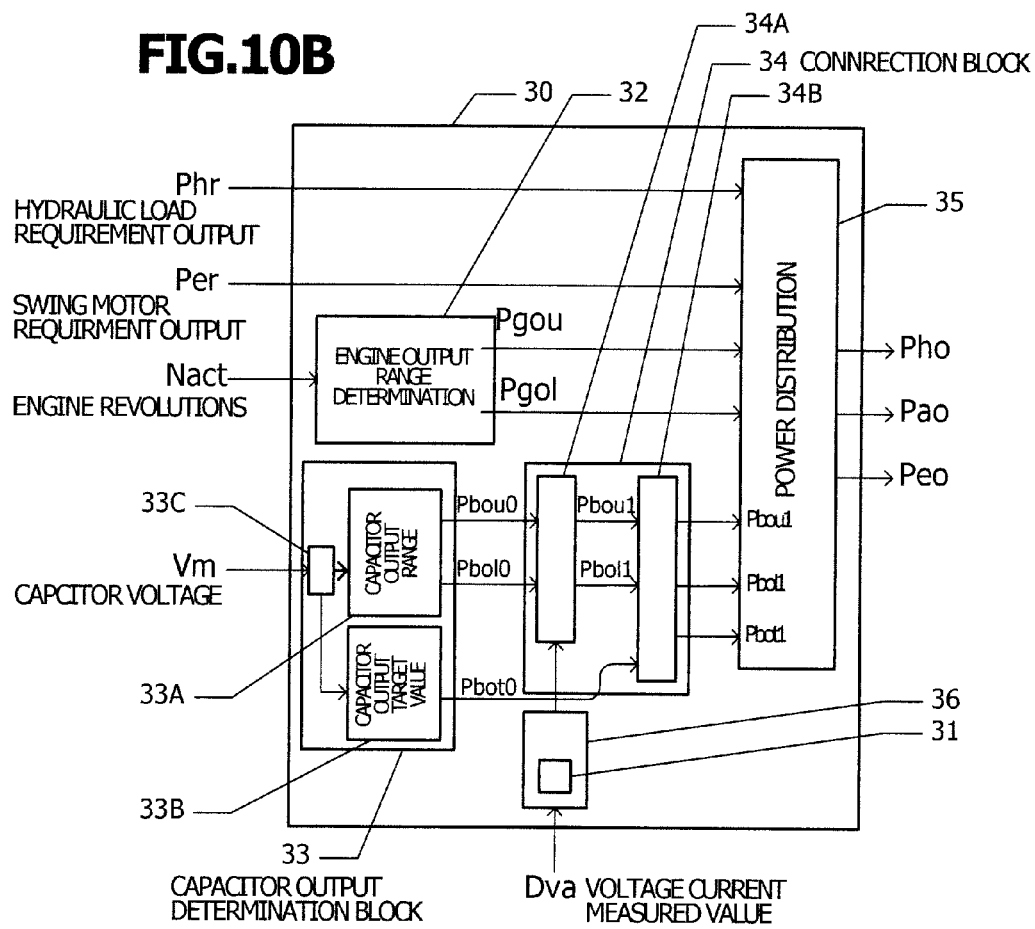
FIG. 10B is a functional block diagram of a controller.

FIG. 10B is a functional block diagram of the controller 30. A hydraulic load requirement output Phr, a swing motor requirement output Per, engine revolutions Nact, and a capacitor voltage Vm are input to the controller 30.

The hydraulic load requirement output Phr is the sum of mechanical powers that are required in hydraulic equipment driven by hydraulic pressure, such as the hydraulic motors 1A and 1B, the boom cylinder 7, the arm cylinder 8, and the bucket cylinder 9 illustrated in FIG. 2. For example, the hydraulic load requirement output Phr is calculated from the operation amount of operation levers that are operated by an operator.

The swing motor requirement output Per corresponds to the electrical power that is required by the swing motor illustrated in FIG. 2. For example, the swing motor requirement output Per is calculated from the operation amount of the operation lever that is operated by the operator.

The engine revolutions Nact correspond to the actual revolutions of the engine 11 illustrated in FIG. 2. The engine 11 is always driven during the operation of the working machine, and its revolutions Nact are detected.

The capacitor voltage Vm corresponds to the terminal-terminal voltage of the capacitor 19 illustrated in FIG. 3, and is measured by the capacitor voltmeter 106.

The engine revolutions Nact are input to an engine output range determination block 32. In the engine output range determination block 32, a map or conversion table for obtaining an engine output upper limit value and an engine output lower limit value from the engine revolutions is stored. The engine output range determination block 32 calculates the engine output upper limit value Pgou and the engine output lower limit value Pgol from the input engine revolutions Nact, and provides the calculated values to a power distribution block 35.

The capacitor voltage Vm is input to a capacitor output determination block 33. The capacitor output determination block 33 includes a capacitor output range determination block 33A, a capacitor output target value determination block 33B, and a charge rate calculation block 33C. The charge rate calculation block 33C calculates the charge rate SOC from the input capacitor voltage Vm. The calculated charge rate SOC is given to the capacitor output range determination block 33A and the capacitor output target value determination block 33B.

Here, the charge rate SOC, for example, may be defined as $Vm^2/V_0^2$. $V_0$ indicates the rated voltage (maximum voltage that is charged by fast charging and slow charging) of the capacitor 19.

In the capacitor output range determination block 33A, a map or conversion table for calculating a capacitor output upper limit value and a capacitor output lower limit value from the charge rate SOC is stored. In the capacitor output target value determination block 33B, a map or conversion table for calculating a capacitor output target value from the charge rate SOC is stored. The capacitor output range determination block 33A obtains the first capacitor output upper limit value Pbou0 and the first capacitor output lower limit value Pbol0 from the charge rate SOC, and provides the obtained values to a correction block 34. The capacitor output target value determination block 33B obtains the first capacitor output target value Pbot0 from the input charge rate SOC, and provides the obtained value to the correction block 34.

A voltage current measured value Dva is input to a capacitor deterioration information determination block 36. The internal resistance of the capacitor 19, for example, as described in steps SA2, SA4, and SA6 is calculated from the voltage current measured value Dva. The capacitor deterioration information determination block 36 executes the process of step SB5 illustrated in FIGS. 5 and 8. The determined operation state, that is, the "normal output state" or the "output limiting state", is stored in an operation state storage region 31.

The correction block 34 includes an output range correction block 34A and an output target value correction block 34B. The first capacitor output upper limit value Pbou0 and the first capacitor output lower limit value Pbol0 are given to the output range correction block 34A. The output range correction block 34A corrects the first capacitor output upper limit value Pbou0 and the first capacitor output lower limit value Pbol0 based on the operation state at the present time, and generates a second capacitor output upper limit value Pbou1 and a second capacitor output lower limit value Pbol1. The second capacitor output upper limit value Pbou1 and the second capacitor output lower limit value Pbol1 are given to the output target value correction block 34B.

The first capacitor output upper limit value Pbou0 corresponds to the upper limit value of the discharge power. The first capacitor output lower limit value Pbol0 is negative, and its absolute value corresponds to the upper limit value of the charge power. By the second capacitor output upper limit value Pbou1 and the second capacitor output lower limit value Pbol1, an appropriate range of the input/output power of the capacitor is defined.

For example, if the operation state at the present time is the normal operation state, the above-described limit values become Pbou1=Pbou0 and Pbol1=Pbol0. That is, the output is not limited. If the operation state at the present time is the output limiting state, the above-described limit values become Pbou1<Pbou0 and Pbol1>Pbol0. The inequality Pbou1<Pbou0 means that the upper limit value of the charge power of the capacitor is made to be smaller than the upper limit value in a normal operation state. The inequality Pbol1>Pbol0 means that the upper limit value of the charge power of the capacitor is made to be smaller than the upper limit value in the normal operation state.

The output target value correction block 34B corrects the first capacitor output target value Pbot0 based on the second capacitor output upper limit value Pbou1 and the second capacitor output lower limit value Pbol1, and generates a second capacitor output target value Pbot1. For example, if the first capacitor output target value Pbot0 departs from the range that is defined by the second capacitor output upper limit value Pbou1 and the second capacitor output lower limit value Pbol1, the output target value correction block 34B generates the second capacitor output target value Pbot1 so that the second capacitor output target value Pbot1 falls within the range that is defined by the second capacitor output upper limit value Pbou1 and the second capacitor output lower limit value Pbol1. The second capacitor output upper limit value Pbou1, the second capacitor output lower limit value Pbol1, and the second capacitor output target value Pbot1 are input to a power distribution block 35.

The power distribution block 35 determines the actual hydraulic load output Pho, the motor generator output Pao, and the swing motor output Peo based on the hydraulic load requirement output Phr, the swing motor requirement output Per, the engine output upper limit value Pgou, the engine output lower limit value Pgol, the second capacitor output upper limit value Pbou1, the second capacitor output lower limit value Pbol1, and the second capacitor output target value Pbot1. At this time, the respective outputs are determined so that the engine output Pgo is within the range of the engine output upper limit value Pgou and the engine output lower limit value Pgol, and the capacitor output Pbo is within the range of the second capacitor output upper limit value Pbou1 and the second capacitor output lower limit value Pbol1.

For example, in the case of the normal state, the converter is controlled so that the input/output power of the capacitor falls within the range that is defined by the first capacitor output upper limit value Pbou0 and the first capacitor output lower limit value Pbol0 before the correction. In the case of the output limiting state, the converter is controlled so that the input/output power of the capacitor falls within the range that is defined by the second capacitor output upper limit value Pbou1 and the second capacitor output lower limit value Pbol1 after the correction.

The controller 30 controls the engine 11, the inverters 18 and 20 illustrated in FIG. 2, and the converter 100 illustrated in FIG. 3 based on the determined outputs as described above.

In the case where the operation state is the "output limiting state", the capacitor output upper limit value becomes smaller than that in the normal operation state, and the absolute value of the capacitor output lower limit value becomes smaller than that in the normal operation state. Accordingly, in the output limiting state, the maximum value of the charge/discharge current of the capacitor 19 becomes smaller than the maximum value of the charge/discharge current in the normal operation state, and thus the deterioration of the capacitor 19 can be suppressed.

Figure 10C:
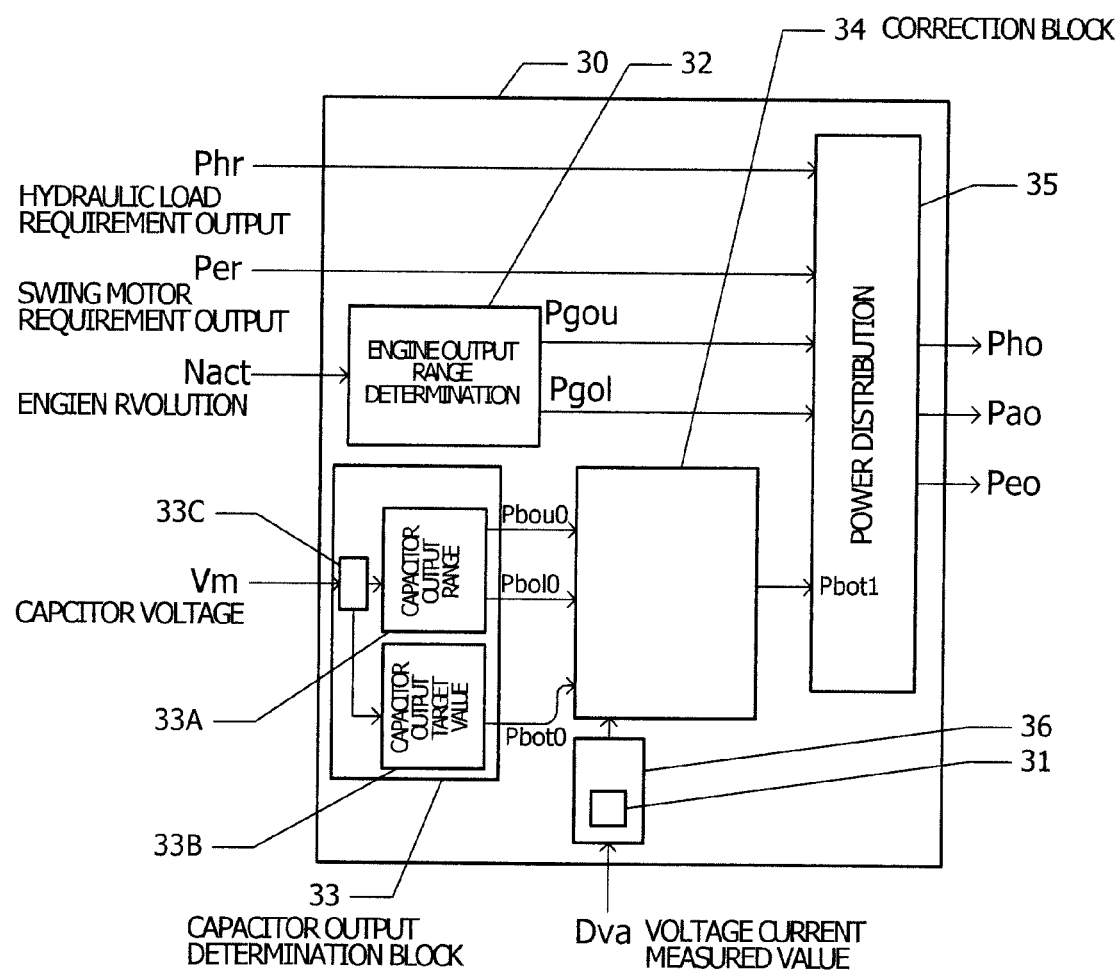
FIG. 10C is a diagram illustrating another example of a controller.

FIG. 10C shows another example of the functional block diagram of the controller 30. Hereinafter, the difference between the controller 30 in FIG. 10C and the controller 30 in FIG. 10B is to be noted. The correction block 34 corrects the first capacitor output target value Pbot0 to the second capacitor output target value Pbot1 based on the first capacitor output upper limit value Pbou0, the first capacitor output lower limit value Pbol0, the first capacitor output target value Pbot0, and the current operation state. For example, if the operation state at the present time is the "output limiting state", the correction block 34 makes the second capacitor output target value Pbot1 after the correction smaller than the first capacitor output target value Pbot0. If the operation state at the present time is the "normal operation state", the correction block 34 performs no correction. That is, the target values becomes Pbot1=Pbot0.

The power distribution block 35 determines the actual hydraulic load output Pho, the motor generator output Pao, and the swing motor output Peo based on the hydraulic load requirement output Phr, the swing motor requirement output Per, the engine output upper limit value Pgou, the engine output lower limit value Pgol, and the second capacitor output target value Pbot1. In this case, the converter 100 is controlled so that the absolute value of the capacitor output Pbo becomes equal to the absolute value of the capacitor output Pbo in the normal operation state or the absolute value of the capacitor output Pbo in the output limiting state becomes equal to or smaller than the absolute value of the capacitor output Pbo in the normal operation state.

Here, as the internal resistance measurement method, the first measurement method illustrated in FIG. 5 and the second measurement method illustrated in FIG. 8 are exemplified. However, it is also possible to measure the internal resistance in other methods.

By measuring the internal resistance during the operation of the working machine, the charge rate SOC can be calculated using the latest measured value of the internal resistance. In this case, the charge rate SOC, for example, may be defined as $Vc^2/V_0^2$. As illustrated in FIG. 6, Vc denotes a voltage that is applied to the capacitance C, and $V_0$ denotes the rated voltage of the capacitor 19.

The voltage Vc can be calculated from the terminal-terminal voltage Vm of the capacitor 19, the charge/discharge current I, and the internal resistance R. The terminal-terminal voltage Vm is measured by the capacitor voltmeter 106 illustrated in FIG. 3, the charge/discharge current I is measured by the capacitor ammeter 107. The internal resistance R is calculated by approximating the second term of the right side of the equation (1) to "0".

By calculating the charge rate SOC using the latest measured value of the internal resistance R, the capacitor output upper limit value Pbou0, the capacitor output lower limit value Pbol0, and the capacitor output target value Pbot0 can be determined based on the latest state of the capacitor 19. The deterioration state of the capacitor 19 is reflected in the latest measured value of the internal resistance R. Accordingly, even in the power distribution control, the deterioration state of the capacitor 19 is reflected, and thus the stability can be enhanced in controlling the working machine.

Embodiment 2

Next, referring to FIGS. 11A to 11C, embodiment 2 will be described. In the embodiment 1 as described above, determination of necessity to limit the output of the capacitor (step SB5 of FIGS. 5 and 8) was performed based on the internal resistance of the capacitor 19. In embodiment 2, determination of necessity to limit the output is performed based on the capacitance of the capacitor. Hereinafter, a method of measuring the capacitance of the capacitor 19 will be described.

Figure 11A:
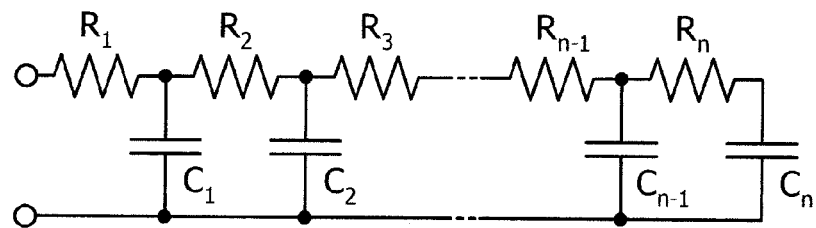
FIG. 11A is an equivalent circuit diagram of an electric double-layer capacitor.

FIG. 11A is an equivalent circuit diagram in the case of using an electric double-layer capacitor as the capacitor 19. In the electric double-layer capacitor, an active layer functions as an electrode that traps anions (negative ions) and cations (positive ions). Plural holes exist on the active layer. The capacitance that is caused by the surface of the active layer and the capacitance that is caused by the deep portion of the hole are greatly different from each other in internal resistance. Accordingly, the capacitor 19 may be expressed as parallel connection of n capacitances $C_1$ to $C_n$, having different internal resistances. Internal resistances $R_1$ to $R_n$ are inserted in series into the capacitances $C_1$ to $C_n$, respectively.

Figure 11B:
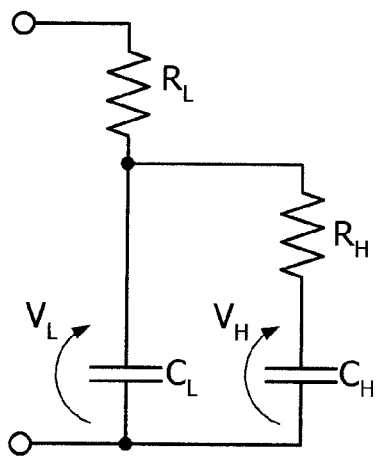
FIG. 11B is a simplified equivalent circuit diagram.

FIG. 11B is a more simplified equivalent circuit diagram of the capacitor 19. In the simplified equivalent circuit diagram, the capacitance 19 is represented by the capacitance $C_L$ having a relatively small internal resistance and the capacitance $C_H$ having a relatively larger internal resistance. Between a pair of electrodes, a series circuit of the capacitance $C_L$ and the internal resistance $R_L$ is inserted. Further, the series circuit of the capacitance $C_H$ and the internal resistance $R_H$ is connected in parallel to the capacitance $C_L$.

The voltage that is applied to the capacitance $C_L$ is represented by "$V_L$" and the voltage that is applied to the capacitance $C_H$ is represented by "$V_H$". The time constant of a closed circuit that includes the capacitances $C_L$ and $C_H$ and the internal resistance $R_H$ is sufficiently larger than the time constant of the series circuit that includes the capacitance $C_L$ and the internal resistance $R_L$. Because of this, in the case of fast charging and fast discharging for several seconds or less, only the capacitance $C_L$ is charged and discharged. In the case of slow charging and slow discharging for about several hours, the charge/discharge of the capacitance $C_H$ is also performed.

Figure 11C:
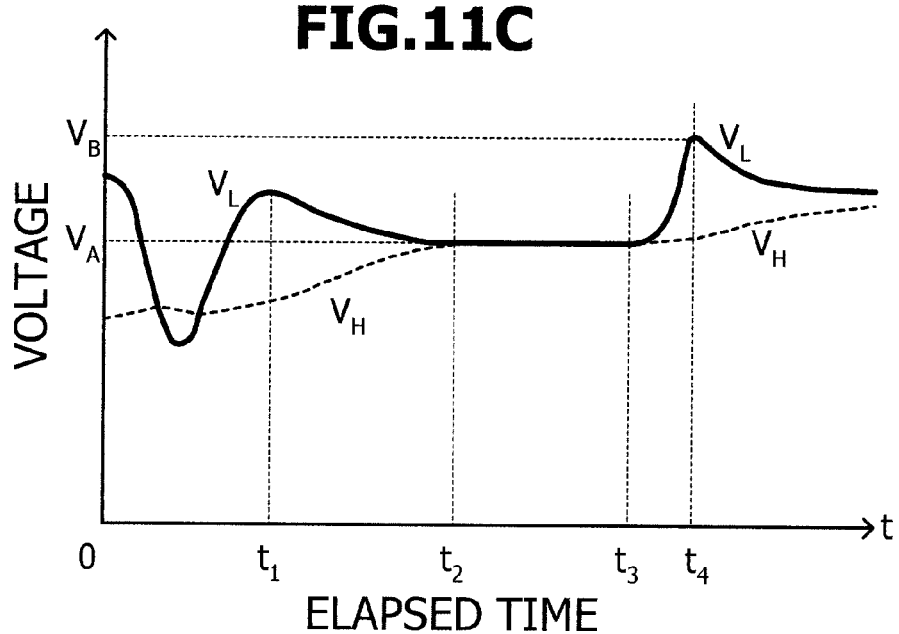
FIG. 11C is a graph illustrating an example of temporal change in voltage across the capacitance CL and voltage across the capacitance CH.

FIG. 11C shows an example of the temporal change in the voltages $V_L$ and $V_H$. In the drawing, a solid line indicates the voltage $V_L$ and a dashed line indicates the voltage $V_H$. In a period from time 0 to $t_1$, an operation is performed. That is, the charge/discharge operation of the capacitor 19 is performed. In the period when the capacitor 19 is discharged, the voltage $V_L$ drops, and in the period when the capacitor 19 is charged, the voltage $V_L$ rises. In a period when the voltage $V_L$ is higher than the voltage $V_H$, the charging to the capacitance $C_H$ is performed, and thus the voltage $V_H$ rises, while in a period when the voltage $V_L$ is lower than the voltage $V_H$, the discharging from the capacitance $C_H$ is performed, and thus the voltage $V_H$ drops. However, since the time constant of the charge/discharge of the capacitance $C_H$ is large, the change in the voltage $V_H$ is slower than the change in the voltage $V_L$.

At time $t_1$, the operation is stopped. That is, the charge/discharge operation of the capacitor 19 is not performed. Because of this, charge moves between the capacitances $C_L$ and $C_H$ until the voltage $V_L$ and the voltage $V_H$ become equal to each other. At time $t_2$, the voltage $V_L$ and the voltage $V_H$ become equal to each other. The voltage at this time is represented by "$V_A$".

At time $t_3$, the capacitor 19 starts charging. This charging is performed by controlling the inverter 18 to make the motor generator 12 in a generation state and controlling the converter 100 to be in a charge state. As the capacitor 19 is charged, the voltages $V_L$ and $V_H$ rise. Since the charging of the capacitor 19 is performed slowly, the voltage $V_H$ also rises slowly. At time $t_4$, the charging operation is stopped. The value of the voltage $V_L$ just after the charging operation is stopped is represented by "$V_B$".

After time $t_4$, the charge transfer from the capacitance $C_L$ to the capacitance $C_H$ is made slowly until the voltages $V_H$ and $V_L$ become equal to each other. If the period from time $t_3$ to $t_4$ is sufficiently short, the charge transfer from the capacitance $C_L$ to the capacitance $C_H$ may be almost disregarded. On this condition, the capacitance $C_L$ can be obtained in the following equation.

$$C_L = \frac{1}{V_B - V_A} \int_{t_3}^{t_4} \{-I(t)\} dt \qquad (4)$$

Here, the current I is current that flows through the capacitor 19. The reason why a minus sign is attached to I(t) is that the direction of the discharge current has been set to be positive. The current I(t) can be measured by the capacitor ammeter 107. For example, the value of the integration term of the above equation is obtained by measuring the current at extremely short intervals and performing a numerical integration of the result of measurement.

Since the charge/discharge current of the capacitor 19 is 0 just before the start of the charging operation at time $t_3$ and just after the stopping of the charging operation at time $t_4$, no voltage drop due to the internal resistance $R_L$ occurs. Because of this, the voltages $V_A$ and $V_B$ are the same as the voltages measured by the capacitor voltmeter 106 at times $t_3$ and $t_4$. The capacitance $C_L$ can be calculated from the result of the numerical integration and the voltages $V_A$ and $V_B$ measured at times $t_3$ and $t_4$.

In embodiment 1, the internal resistance of the capacitor 19 is measured in step SB1 illustrated in FIG. 8, and in embodiment 2, the capacitance $C_L$ is calculated based on the above-described equation 4. In step SB5, necessity of the output limiting is determined based on the capacitance $C_L$. The process after the determination of the output limiting is common to the process according to embodiment 1.

In this case, necessity of the output limiting may be determined based on both the internal resistance and the capacitance.

Embodiment 3

Next, referring to FIGS. 12A to 14C, embodiment 3 will be described. In embodiment 3, the process of the charge rate calculation block 33C illustrated in FIG. 10B is different from the process according to the first embodiment, and other configuration is the same as the configuration according to embodiment 1.

Figure 12A:
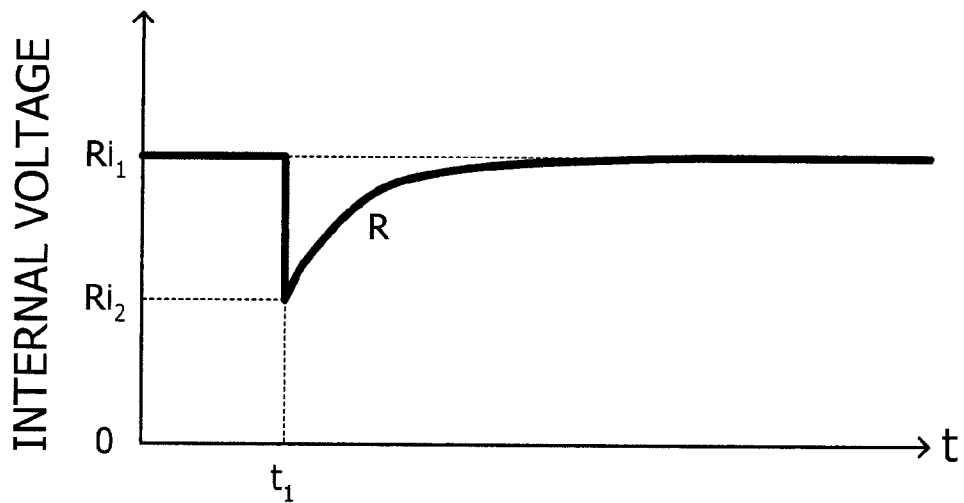
FIG. 12A is a graph illustrating transient characteristics of an internal resistance.

FIG. 12A shows the transient characteristics of the internal resistance R when the discharge current starts to flow from the state where the charge/discharge current of the capacitor 19 is 0. FIG. 12C shows the change in the charge/discharge current of the capacitor 19. At time $t_1$, the discharge current starts to flow. Although the discharge current is actually decreased with a predetermined time constant, the transient period until the internal resistance R returns to a steady state is sufficiently short in comparison to the time constant of the discharge current. Because of this, even in consideration of the transient characteristics of the internal resistance R, it may be considered that the discharge current is almost constant. The constant discharge current is represented by "$I_1$".

The internal resistance in the steady state of the capacitor 19 is represented by "$Ri_1$". This internal resistance $Ri_1$ may be calculated by the method according to embodiment 1. At time $t_1$, if the discharge current starts to flow from the capacitor 19, the internal resistance R is lowered up to $Ri_2$, and thereafter, it is gradually increased toward the internal resistance $Ri_1$ in the steady state.

The internal resistance R after time $t_1$ may be expressed by the following equation.

$$R = Ri_2 + (Ri_1 - Ri_2)\left(1 - \exp\left(-\frac{t - t_1}{\tau}\right)\right) \qquad (5)$$

If the time t becomes infinite, the internal resistance R approximates the internal resistance $Ri_1$ in the steady state.

In order to calculate the charge rate SOC of the capacitor 19, the voltage Vc that is applied to the capacitance C illustrated in FIG. 6 should be calculated. However, the voltage that is actually measured by the capacitor voltmeter 106 is the terminal-terminal voltage Vm. Among the voltage drop Vr by the internal resistance R, the voltage Vc applied to the capacitance C, and the terminal-terminal voltage Vm, the following equation is established.

$$Vm = Vr + Vc$$

$$Vr = R \times I \qquad (6)$$

The reason why a minus sign is attached to the right side of the equation that indicates the voltage drop Vr is that the direction of the discharge current that flows through the capacitor 19 has been defined to be positive. Among the parameters of equation 6, the terminal-terminal voltage Vm and the current I can be actually measured.

Figure 12B:
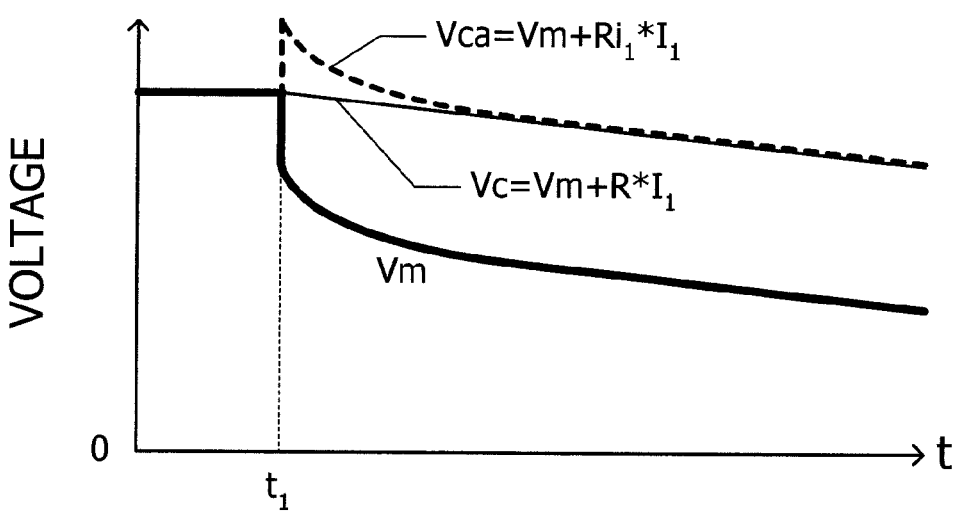
FIG. 12B is a graph showing an actual measured value of a terminal-terminal voltage Vm, a theoretical value of a voltage Vc across a capacitance C, and an approximately calculated value Vca of a voltage across the capacitance C.
Figure 12C:
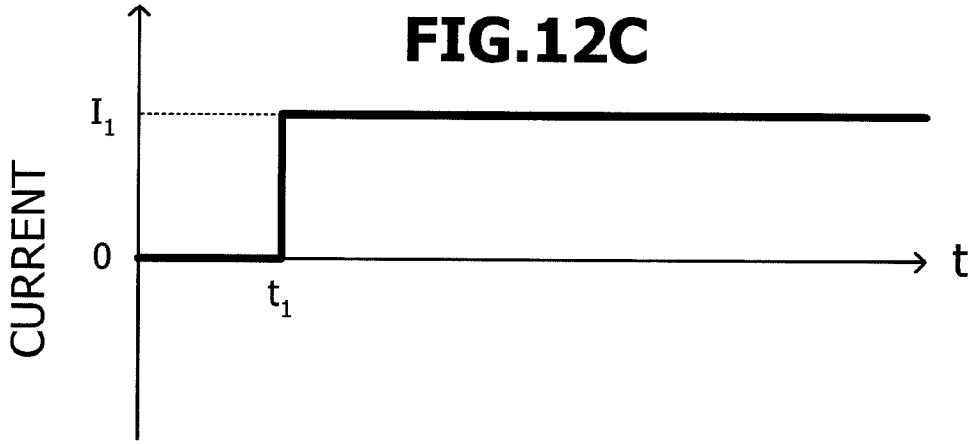
FIG. 12C is a graph showing temporal change in charge/discharge current of a capacitor.

FIG. 12B shows the time-history of the terminal-terminal voltage Vm and the voltage Vc that is applied to the capacitance C. In the period up to time $t_1$, the current that flows through the capacitor 19 is 0, and thus the voltage Vc and the terminal-terminal voltage Vm are the same.

At time $t_1$, current $I_1$ starts to flow. Since it is assumed that the current $I_1$ is constant, the accumulated charge amount Q of the capacitance C is linearly reduced. Because of this, the voltage Vc also drops linearly. The terminal-terminal voltage Vm is expressed by the following equation.

$$Vm = Vc - R \times I_1 \qquad (7)$$

That is, the terminal-terminal voltage Vm takes a value that is smaller than the voltage Vc by $R \times I_1$. Since the voltage Vc drops linearly, and the internal resistance R is transiently changed as illustrated in FIG. 12A, transient change occurs in the terminal-terminal voltage Vm. That is, at time $t_1$, a voltage drop that corresponds to $(Ri_1 - Ri_2) \times I_1$ occurs. As the time elapses, the internal resistance R is increased toward $Ri_1$, and thus the difference between the terminal-terminal voltage Vm and the voltage Vc becomes increased. If the internal resistance R is in the steady state, that is, if the internal resistance R is restored up to $Ri_1$, the difference between the terminal-terminal voltage Vm and the voltage Vc becomes ($Ri_1 \times I_1$).

The voltage Vc can be calculated by equation 7 from the measured value of the terminal-terminal voltage Vm, the measured value of the current $I_1$, and the internal resistance R. The internal resistance R can be calculated from the parameter $Ri_1$, $Ri_2$, and represented in equation 5. These parameters are stored in the charge rate calculation block 33C illustrated in FIG. 10B.

The charge rate calculation block 33C calculates the voltage Vc based on the parameters $Ri_1$, $Ri_2$, and $\tau$, the measured value of the terminal-terminal voltage Vm, and the measured value of the current $I_1$. Further, the charge rate calculation block 33C calculates the charge rate SOC based on the calculated voltage Vc.

The voltage Vca applied to the capacitance C that is calculated on the assumption that the internal resistance R is $R = Ri_1$, without considering the transient phenomenon of the internal resistance R is indicated by a dashed line in FIG. 12B. The difference between the terminal-terminal voltage Vm and the voltage Vca is constant as $Ri_1 \times I_1$. Because of this, if Vca is adopted as the voltage that is applied to the capacitance C, at time $t_1$, the voltage discontinuity occurs. If the charge rate SOC is calculated based on the voltage Vca, the discontinuity also occurs in the calculated charge rate SOC at time $t_1$. If the charge rate SOC is changed discontinuously, the first capacitor output upper limit value Pbou0, the first capacitor output lower limit value Pbol0, and the first capacitor output target value Pbot0, which are calculated based on the charge rate SOC, are also changed discontinuously. Accordingly, the distribution control that is performed by the power distribution block 35 becomes unstable.

By calculating the charge rate SOC in consideration of the transient phenomenon of the internal resistance R, the discontinuous change in the calculated value of the charge rate SOC can be prevented. Accordingly, unstable power distribution control can be avoided.

If sufficiently long time elapses from time $t_1$, the difference between the internal resistance R and the internal resistance $Ri_1$ in the steady state becomes smaller. After the difference between them becomes smaller than a specified reference value, the internal resistance $Ri_1$ in the steady state may be used as the internal resistance R rather than the value that is calculated using the equation 5.

The transient change in the internal resistance R occurs when the state is changed from the state where no current flows through the capacitor 19 to the state where the charge current starts to flow, when the state is changed from the discharge state to the charge state, and when the state is switched over from the charge state to the discharge state.

Figure 13A:
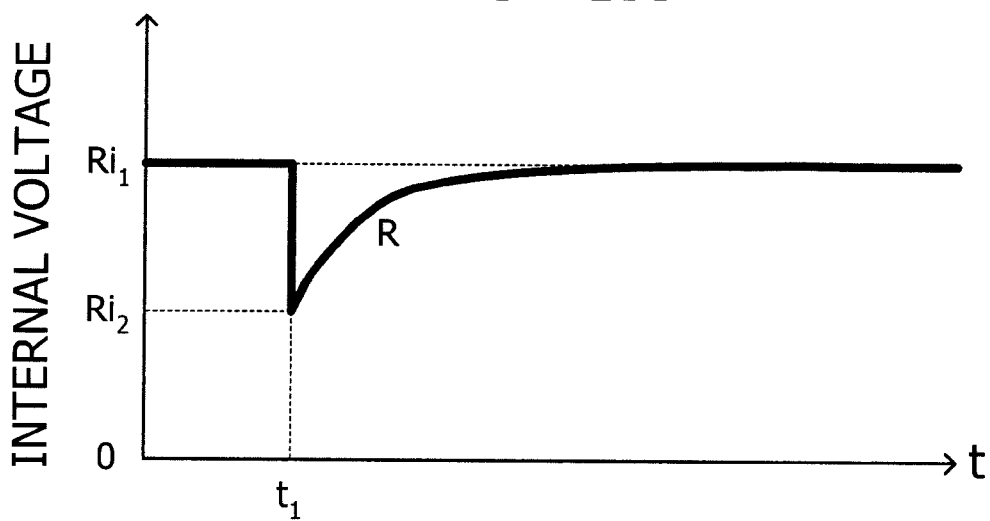
FIG. 13A is a graph illustrating transient characteristics of an internal resistance.
Figure 13B:
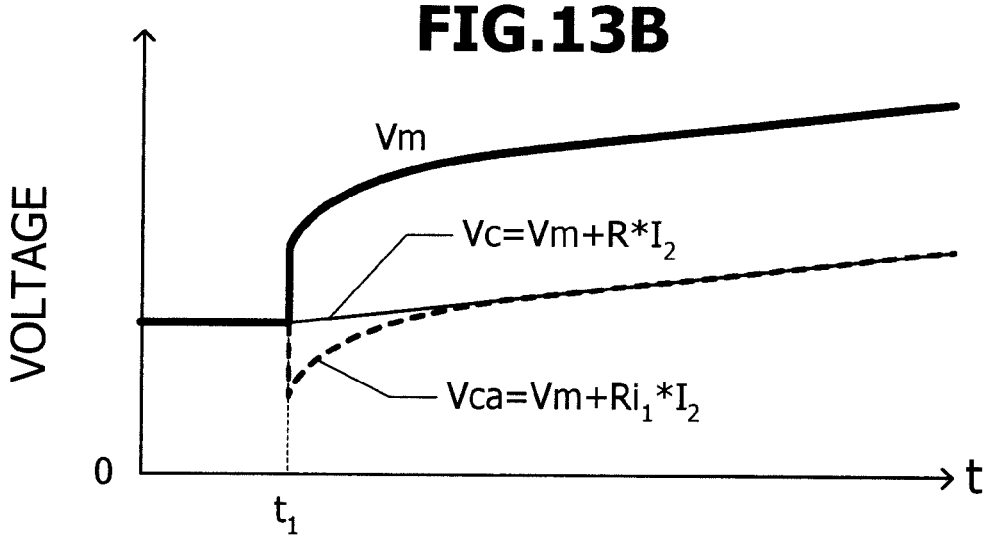
FIG. 13B is a graph showing an actual measured value of a terminal-terminal voltage Vm, a theoretical value of a voltage Vc across the capacitance C, and an approximately calculated value Vca of a voltage across the capacitance C.
Figure 13C:
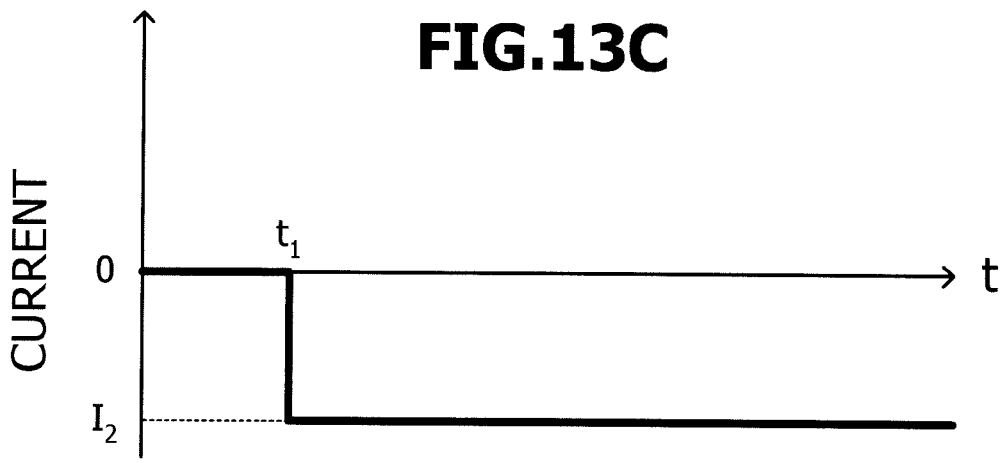
FIG. 13C is a graph showing temporal change in charge/discharge current of a capacitor.

FIGS. 13A, 13B, and 13C show the change in the internal resistance R, the voltage change, and the current change when the charge current starts to flow. The change in the internal resistance R illustrated in FIG. 13A is the same as the change illustrated in FIG. 12A. The charge current after time $t_1$ has a constant value $I_2$ ($I_2$<0).

The voltage Vc applied to the capacitance C rises linearly as illustrated in FIG. 13B. This voltage Vc is calculated by the actually measured value of the terminal-terminal voltage Vm, the actually measured value $I_2$ of the charge current, and the internal resistance R in consideration of the transient phenomenon. The voltage Vca that is applied to the capacitance C calculated on the assumption that the internal resistance R is always $Ri_1$, without considering the transient phenomenon, becomes discontinuous at time $t_1$.

Figure 14A:
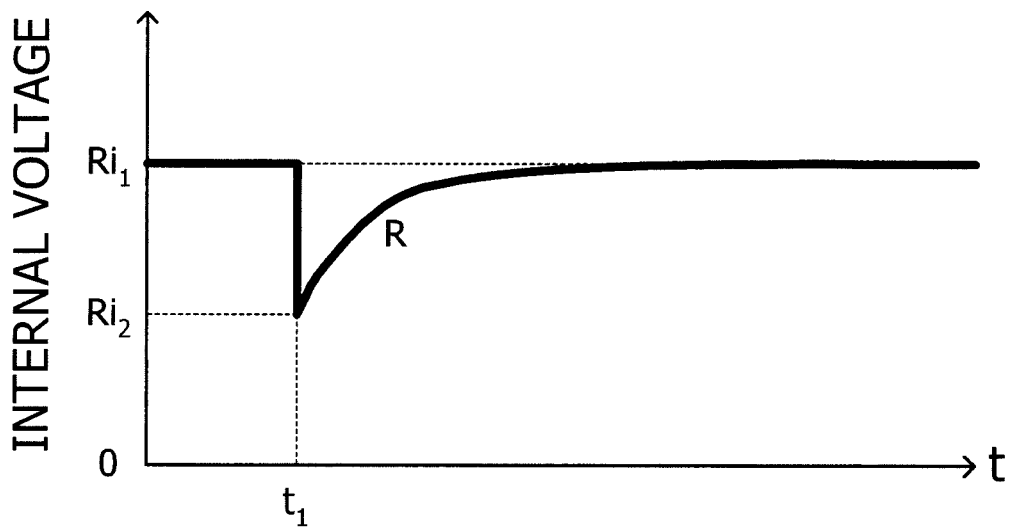
FIG. 14A is a graph illustrating transient characteristics of an internal resistance.
Figure 14B:
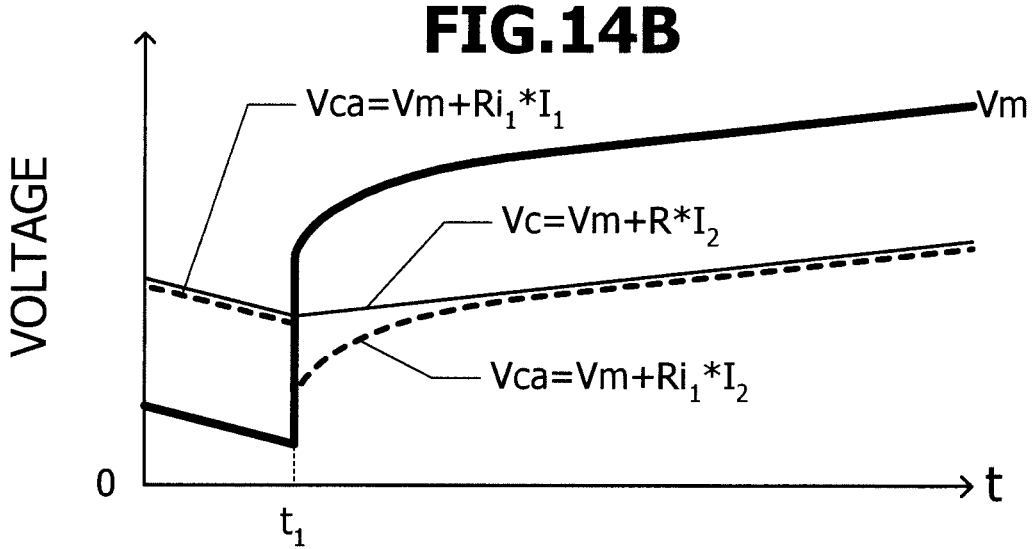
FIG. 14B is a graph showing an actual measured value of a terminal-terminal voltage Vm, a theoretical value of a voltage Vc across the capacitance C, and an approximately calculated value Vca of a voltage across the capacitance C.
Figure 14C:
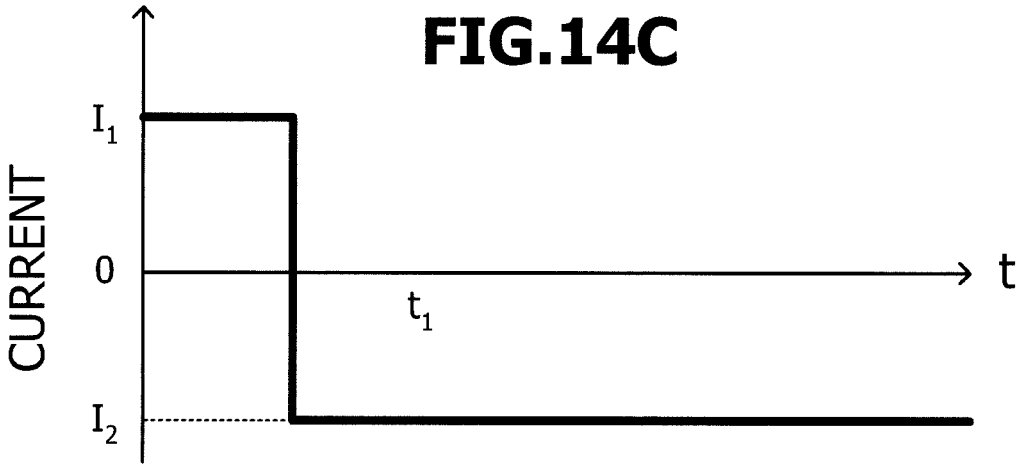
FIG. 14C is a graph showing temporal change in charge/discharge current of a capacitor.

FIGS. 14A, 14B, and 14C show the change in the internal resistance R, the voltage change, and the current change when the state is changed from the discharge state to the charge state, respectively. The change in the internal resistance R illustrated in FIG. 14A is the same as the change illustrated in FIG. 12A. The discharge current before time $t_1$ is $I_1$, and the charge current after time $t_1$ is $I_2$.

Since the direction of current that flows through the capacitor 19 is inverted at time $t_1$, the terminal-terminal voltage Vm is discontinuously changed. If the voltage Vca applied to the capacitance C is calculated on the assumption that the internal resistance R is equal to the internal resistance $Ri_1$ in the steady state, the voltage Vca becomes discontinuous at time $t_1$. By calculating the voltage Vc in consideration of the transient phenomenon of the internal resistance R, the discontinuous change in the voltage Vc can be prevented.

Embodiment 4

Figure 15A:
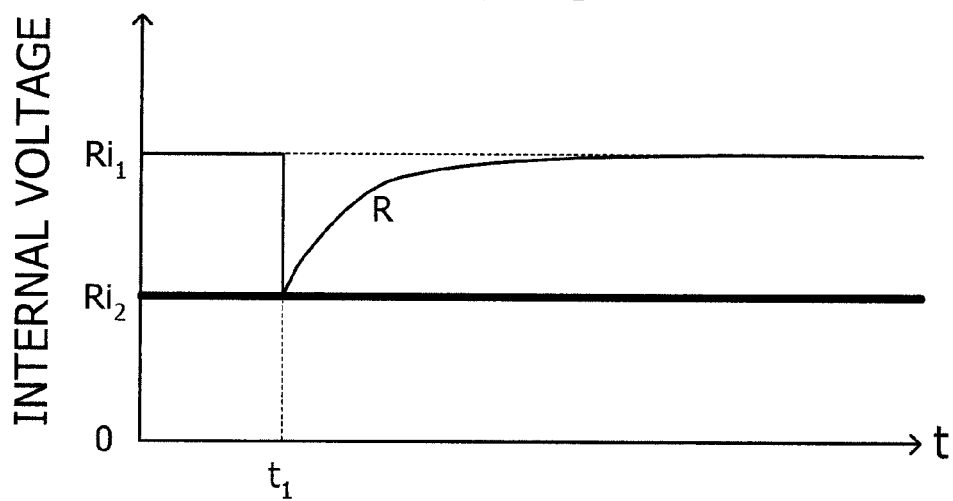
FIG. 15A is a graph illustrating transient characteristics of an internal resistance and an approximate value.
Figure 15B:
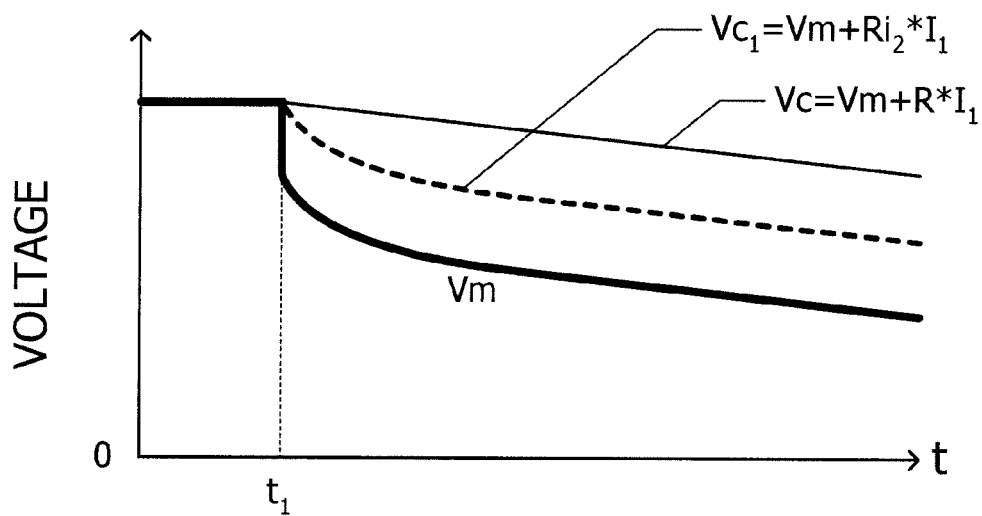
FIG. 15B is a graph showing an actual measured value of a terminal-terminal voltage Vm, a theoretical value of a voltage Vc across the capacitance C, and an approximately calculated value Vc 1 of a voltage across the capacitance C.

Next, referring to FIGS. 15A to 15C, embodiment 4 will be described. In embodiment 3, the voltage Vc that is applied to the capacitance C is calculated using the value calculated in equation 5 that faithfully follows the actual change as the internal resistance R in a period when the internal resistance R of the capacitor 19 is transiently changed. In embodiment 4, it is assumed that the internal resistance R that is used to calculate the voltage Vc is constant and equal to the minimum value $Ri_2$ of the internal resistance R in the transient period.

Figure 15C:
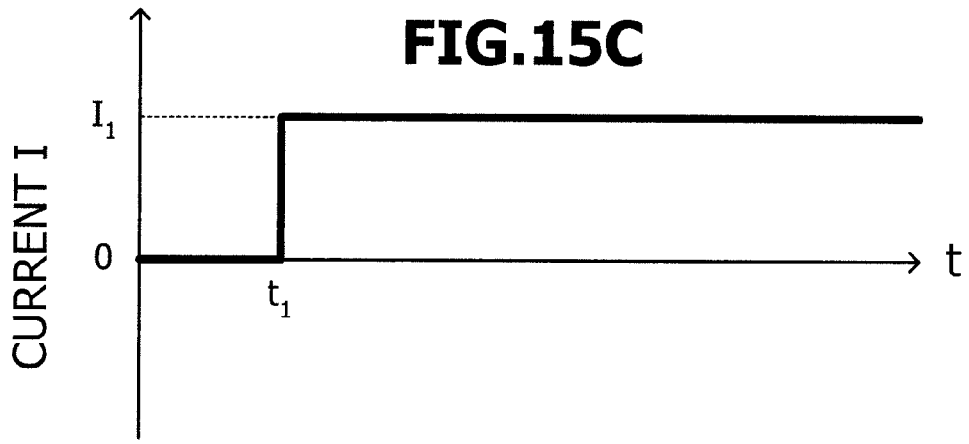
FIG. 15C is a graph showing temporal change in charge/discharge current of a capacitor.

As illustrated in FIG. 15C, the discharge current $I_1$ starts to flow at time $t_i$. As illustrated in FIG. 15A, although the internal resistance R is transiently changed, it is assumed that the internal resistance has a constant value $Ri_2$ in calculating the voltage Vc. The voltage $Vc_1$ applied to the capacitance C and the voltage Vc actually applied to the capacitance C, which are calculated on the above-described assumption, is expressed in the following equation.

$$Vc_1 = Vm + Ri_2 \times I_1$$

$$Vc = Vm + R \times I_1 \quad (8)$$

At time $t_1$, since the internal resistance R is $R=Ri_2$, it is realized that the voltages satisfy $Vc_1=Vc$ at time $t_1$. Because of this, the voltage $Vc_1$ is not discontinuously changed at time $t_1$. Accordingly, as is the case with the embodiment 3, the power distribution control is avoided from being unstable.

In embodiment 4, the charge rate calculation block 33C calculates the voltage $Vc_1$ that is generated in the capacitance C based on the equation 8, by the measured value of the terminal-terminal voltage Vm, the measured value of the current $I_1$, and the minimum value $Ri_2$ of the internal resistance. The minimum value $Ri_2$ of the internal resistance is pre-stored in the charge rate calculation block 33C.

In embodiment 4, even after the internal resistance R reaches the steady state, the voltage $Vc_1$ is calculated under assumption of $R=Ri_2$. Accordingly, in the steady state, the voltage $Vc_1$ for calculating the charge rate SOC becomes different from the voltage Vc that is actually applied to the capacitance C. However, since the voltage $Vc_1$ that is used to calculate the charge rate SOC is not discontinuously changed, the stability of the power distribution control is maintained.

The method according to embodiment 4 can be applied even when the charge current starts to flow from the "0" state.

In the method according to embodiment 4, when the current is changed from the discharge state to the "0" state, and when the current is changed from the charge state to the "0" state, the calculation result of the voltage $Vc_1$ becomes discontinuous. However, since the current is "0", that is, since the input/output energy through the capacitance 19 is "0", the power distribution control may not be unstable.

Further, even when the state is changed from the charge state to the discharge state or from the discharge state to the charge state, the voltage $Vc_1$ is discontinuously changed. However, the size of discontinuity of the voltage $Vc_1$ that is calculated with the fixed internal resistance of $Ri_2$ is smaller than the size of discontinuity of the voltage Vca that is calculated with the fixed internal resistance of $Ri_1$. Because of this, the unstable state of the power distribution control is reduced in comparison to the case where the charge rate SOC is calculated based on the voltage Vca.

Embodiment 5

Figure 16A:
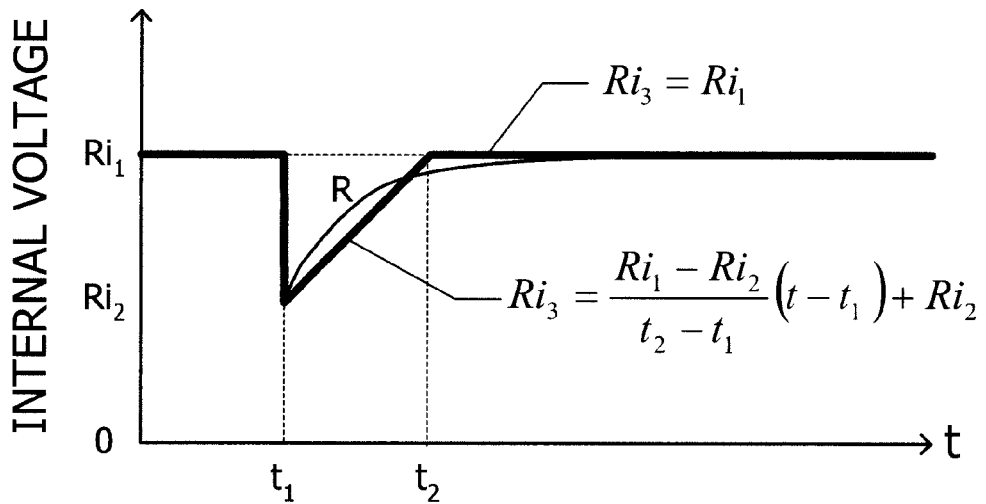
FIG. 16A is a graph illustrating transient characteristics of an internal resistance and an approximate value.
Figure 16B:
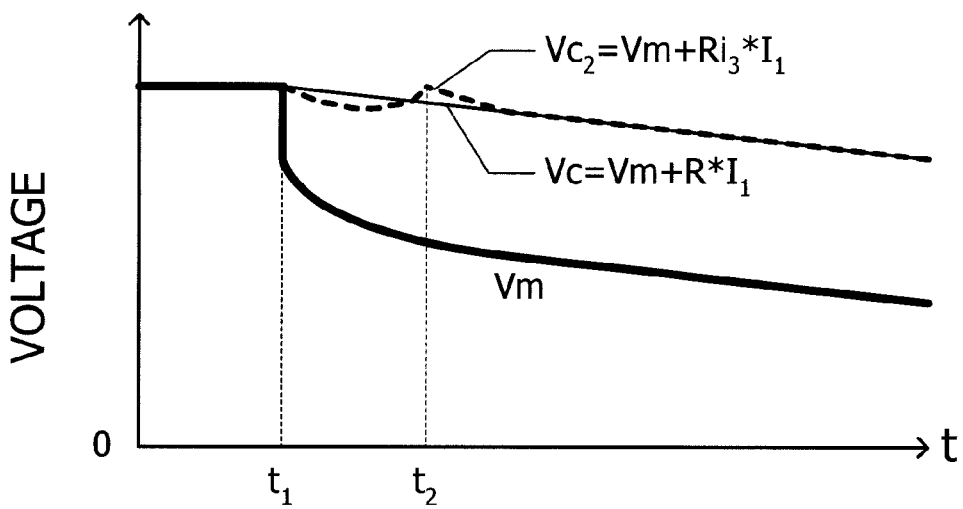
FIG. 16B is a graph showing an actual measured value of a terminal-terminal voltage Vm, a theoretical value of a voltage Vc across the capacitance C, and an approximately calculated value Vc2 of a voltage across the capacitance C.

Next, referring to FIGS. 16A to 16C, embodiment 5 will be described. In embodiment 3, the voltage Vc that is applied to the capacitance C is calculated using the value that faithfully follows the actual change as the internal resistance R in a period when the internal resistance R of the capacitor 19 is transiently changed. In embodiment 5, it is approximated that the internal resistance R that is used to calculate the voltage Vc is linearly changed.

Figure 16C:
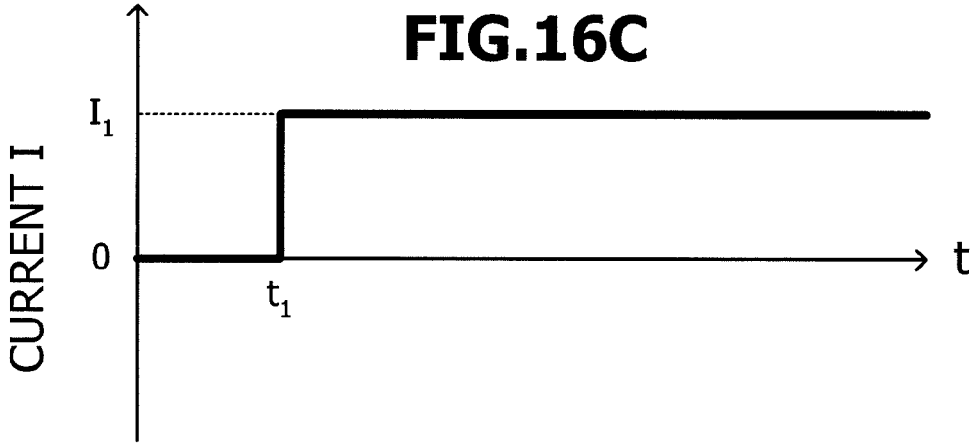
FIG. 16C is a graph showing temporal change in charge/discharge current of a capacitor.

As illustrated in FIG. 16C, the discharge current $I_1$ starts to flow at time $t_i$. FIG. 16A illustrates the change in the internal resistance R and its approximate value $Ri_3$. The approximate value $Ri_3$ of the internal resistance is defined by the following equation.

$$Ri_3 = \frac{Ri_1 - Ri_2}{t_2 - t_1}(t - t_1) + Ri_2 \quad (t_1 \le t \le t_2) \tag{9}$$

$$Ri_3 = Ri_1 \quad (t_2 < t)$$

The approximate value $Vc_2$ of the voltage Vc that is applied to the capacitance C is calculated by the following equation.

$$Vc_2 = Vm + Ri_3 \times I_1 \tag{10}$$

At time $t_1$, since the equation $Ri_3 = R$ holds true, it is realized that the voltages satisfy $Vc_2 = Vc$. Because of this, the voltage $Vc_2$ is not discontinuously changed at time $t_1$. If the internal resistance R is in the steady state, that is, the internal resistance R is $R = Ri_1$, the approximate value $Vc_2$ becomes equal to the voltage Vc that is applied to the capacitance C.

Further, at time $t_2$, since the slope of the approximate value $Ri_3$, of the internal resistance become discontinuous, the slope of the approximate value $Vc_2$ of the voltage is also changed discontinuously. However, the magnitude of the approximate value $Vc_2$ may not be discontinuously changed.

The method according to embodiment 5 can be applied to any case, that is, when the state in which the current is "0" is changed to the charge state, when the discharge state is changed to the state in which the current is "0", when the charge state is changed to the discharge state, or when the discharge state is changed to the charge state.

Embodiment 6

Next, referring to FIGS. 17 to 20B, embodiment 6 will be described. In embodiment 6, an example of processing of the power distribution block 35 illustrated in FIG. 10B will be described.

Figure 17:
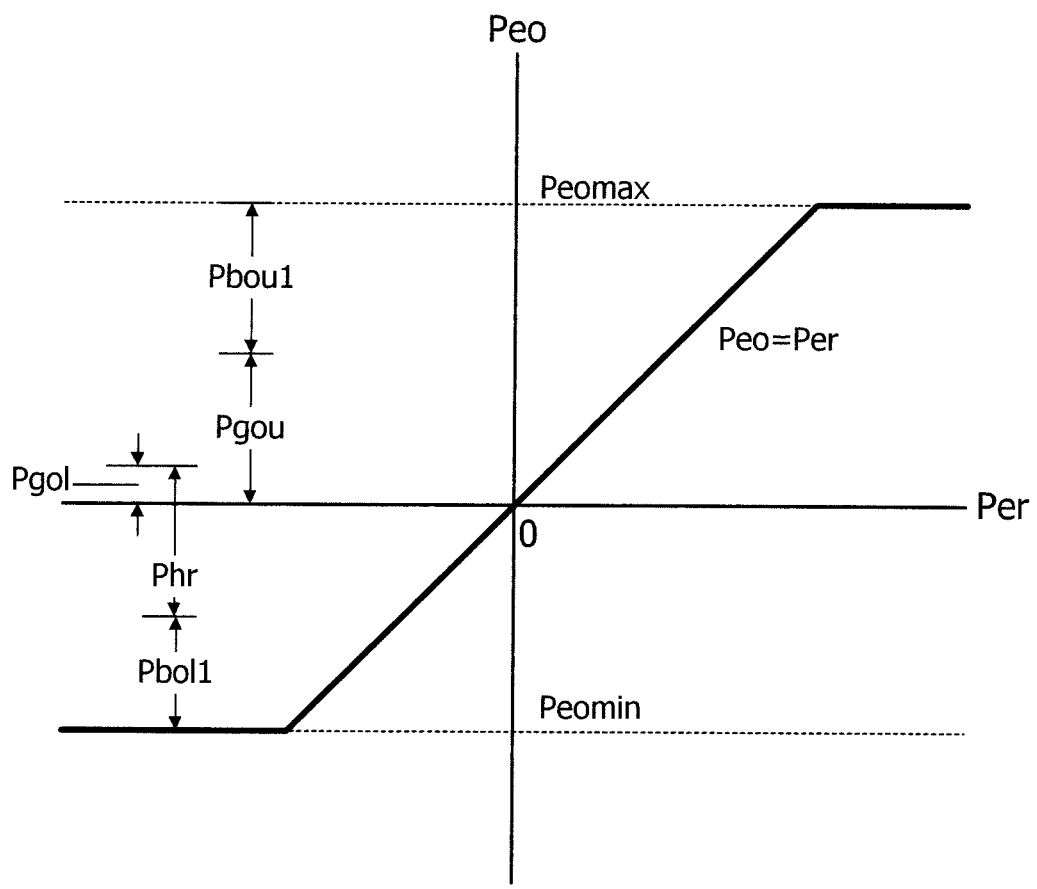
FIG. 17 is a graph showing the relationship between a swing motor output and a swing motor requirement output when a power distribution method according to embodiment 6 is applied.

FIG. 17 is a graph showing the relationship between a swing motor requirement output Per and a swing motor output Peo. If the swing motor requirement output Per is larger than the sum value Peomax of the engine output upper limit value Pgou and the second capacitor output upper limit value Pbou1, the swing motor output Peo is made to be equal to the sum value Peomax. That is,

*Peo=Pgou+Pbou.*

This means that the swing motor output Peo does not exceed the maximum power that can be extracted from the engine 11 and the electric storage circuit 90.

If the swing motor requirement output Per is smaller than a value Peomin that is obtained by subtracting absolute values of the hydraulic load requirement output Phr and the second capacitor output lower limit value Pbol1 from the engine output lower limit value Pgol, the swing motor output Peo is made to be equal to the value Peomin. That is,

*Peo=Pgol−Phr+Pgo*min.

Since Pbomin has a negative value, in the above-described equation, the operator attached to Pbomin is "+" (plus). This equation means that in a state where the engine 11 is operated so that the power extracted from the engine 11 becomes smallest, the generation power of the swing motor 21 does not exceed the sum value of the hydraulic load requirement output Phr and the upper limit value of the power that can be supplied to the electric storage circuit 90.

If the swing motor requirement output Per is between Peomax and Peomin, the swing motor output Peo is made equal to the swing motor requirement output Per. That is,

*Peo=Per.*

This equation means that the required output is secured with respect to the swing motor.

Figure 18:
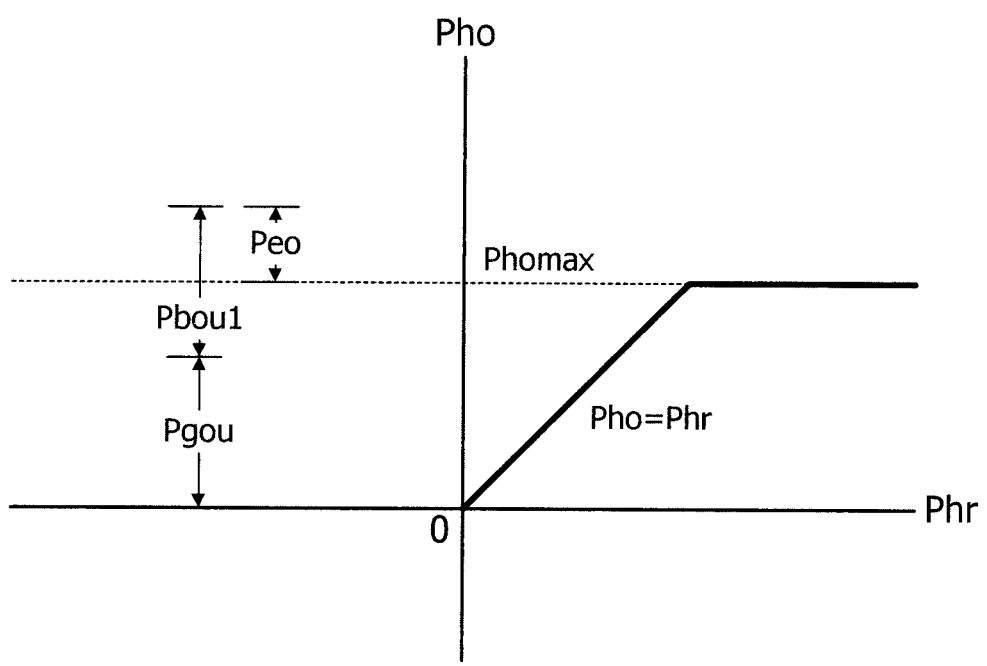
FIG. 18 is a graph showing the relationship between a hydraulic load output and a hydraulic load requirement output when a power distribution method according to embodiment 6 is applied.

FIG. 18 shows the relationship between the hydraulic load requirement output Phr and the hydraulic load output Pho. If the hydraulic load requirement output Phr exceeds the value Phomax that is obtained by subtracting the swing motor output Peo from the sum value of the engine output upper limit value Pgou and the second capacitor output upper limit value Pbou1, the hydraulic load output Pho is made to be equal to the value Phomax. That is,

*Pho=Pgou+Pbou1−Peo.*

This means that the hydraulic load output Pho does not exceed the remaining power that is obtained by extracting the power of the predetermined swing motor output Peo from the maximum power that can be extracted from the engine 11 and the electric storage circuit 90.

If the hydraulic load requirement output Phr is equal to or lower than Phomax, the hydraulic load output Pho is made to be equal to the hydraulic load requirement output Phr. That is,

*Pho=Phr.*

This means that the required output is secured with respect to the hydraulic load.

Figure 19A:
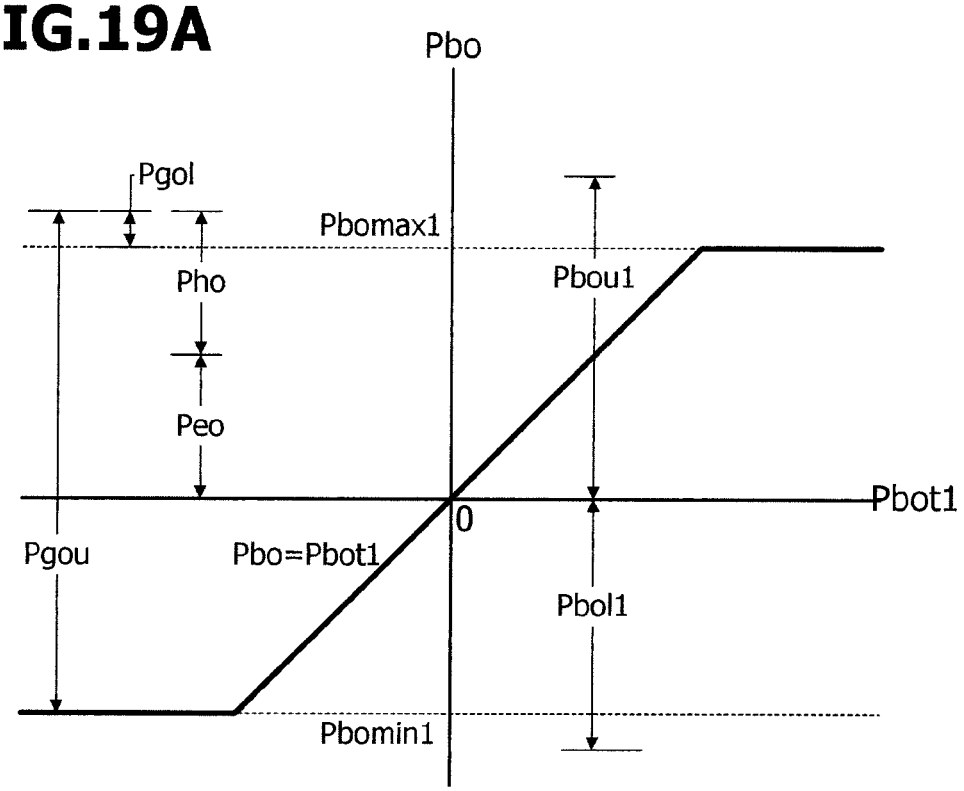
FIGS. 19A and 19B are graphs showing the relationship between a capacitor output and a second capacitor output target value when a power distribution method according to embodiment 6 is applied.
Figure 19B:
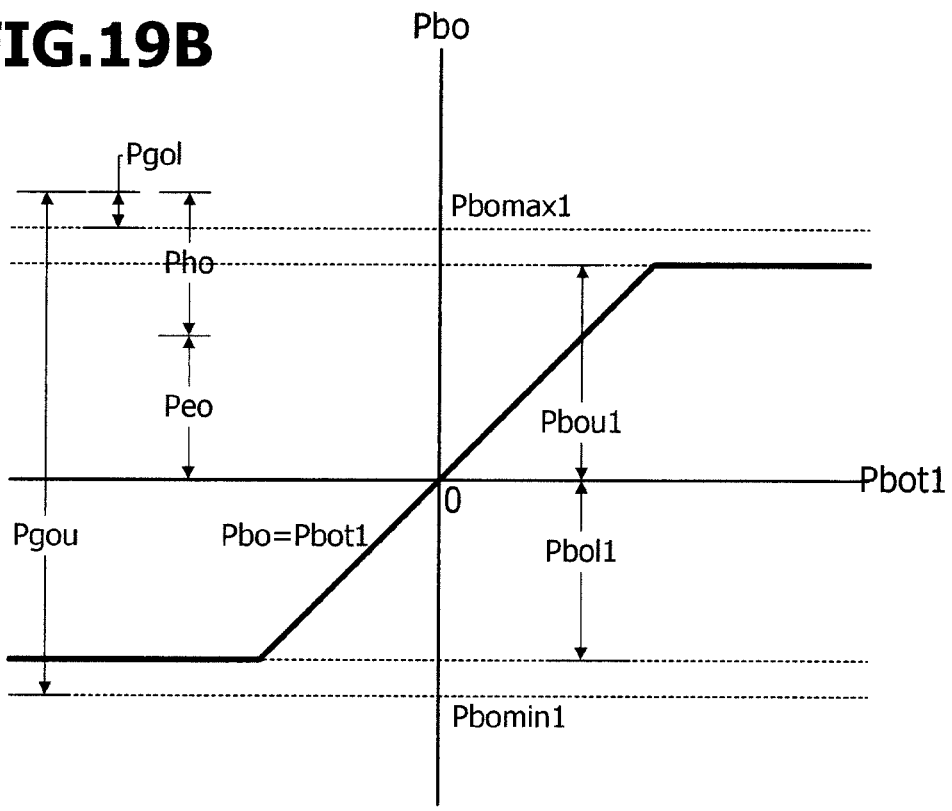

FIGS. 19A and 19B show the relationship between the second capacitor output target value Pbot1 and the capacitor output Pbo. The value, which is obtained by subtracting the engine output lower limit value Pgol from the sum value of the swing motor output Peo determined based on the graph illustrated in FIG. 17 and the hydraulic load output Pho determined based on the graph illustrated in FIG. 18, is represented by Pgomax1. The value, which is obtained by subtracting the engine output upper limit value Pgou from the sum value of the swing motor output Peo and the hydraulic load output Pho, is represented by Pbomin1.

FIG. 19A shows a case where Pbomax1 is smaller than the second capacitor output upper limit value Pbou1 and Pbomin1 is larger than the second capacitor output lower limit value Pbol1. If the second capacitor output target value Pbot1 exceeds Pbomax1, the capacitor output Pbo is made to be equal to Pbomax1. This means that since the power that can be extracted from the electric storage circuit 90 is sufficiently large, the engine 11 is operated with the output lower limit value Pgol, and the surplus power is not extracted from the electric storage circuit 90. If the second capacitor output target value Pbot1 is below Pbomin1, the capacitor output Pbo is made to be equal to Pbomax1. This means that since the charge rate of the electric storage circuit 90 is not sufficient, the engine 11 is operated with the output upper limit value Pgou to supply the power to the electric storage circuit 90.

If the second capacitor output target value Pbot1 is between Pbomax1 and Pbomin1, the capacitor output Pbo is made to be equal to the second capacitor output target value Pbot1. Accordingly, the charge rate of the electric storage circuit 90 can be close to the target value of the charge rate.

FIG. 19B shows a case where Pbomax1 is larger than the second capacitor output upper limit value Pbou1 and Pbomin1 is smaller than the second capacitor output lower limit value Pbol1. In this case, the upper and lower limit values of the capacitor output Pbo is limited so that the capacitor output Pbo falls within the range (an appropriate range) between the second capacitor output upper limit value Pbou1 and the second capacitor output lower limit value Pbol1.

As described above, the upper limit of the capacitor output Pbo is limited to a value that is a smaller one of Pbou1 and Pbomax1, and the lower limit thereof is limited to a value that is larger one of Pbol1 and Pbomin1.

Figure 20A:
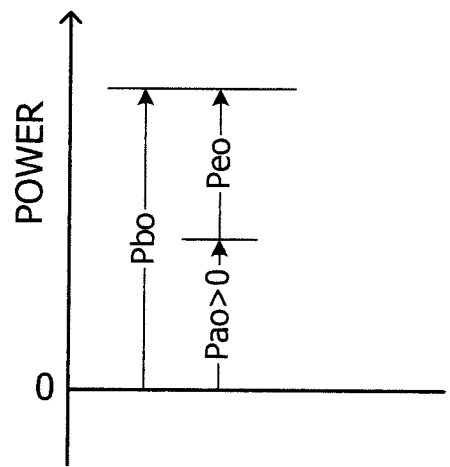
FIGS. 20A and 20B are graphs showing the relationship between a motor generator output, capacitor output, and a swing motor output when a power distribution method according to embodiment 6 is applied.
Figure 20B:
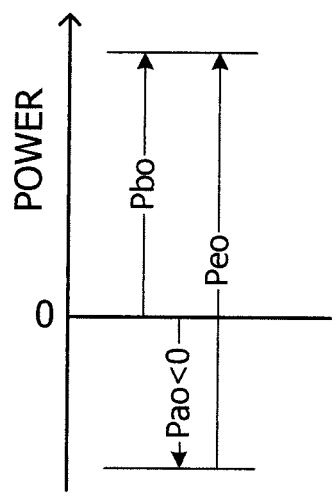

FIGS. 20A and 20B are diagrams illustrating a method of determining a motor generator output Pao. From FIG. 10A, it can be known that the following equation is established.

$$Pbo = Pao + Peo$$

If the capacitor output Pbo and the swing motor output Peo are determined, the output Pao of the motor generator 12 is calculated from the above-described equation.

As illustrated in FIG. 20A, if the capacitor output Pbo is larger than the swing motor output Peo, the motor generator 12 is assist-operated by the surplus power to output the power Pao. As illustrated in FIG. 20B, if the capacitor output Pbo is smaller than the swing motor output Peo, in order to supplement the insufficient power, the motor generator 12 is generation-operated to output the power Pao.

Embodiment 7

Figure 21:
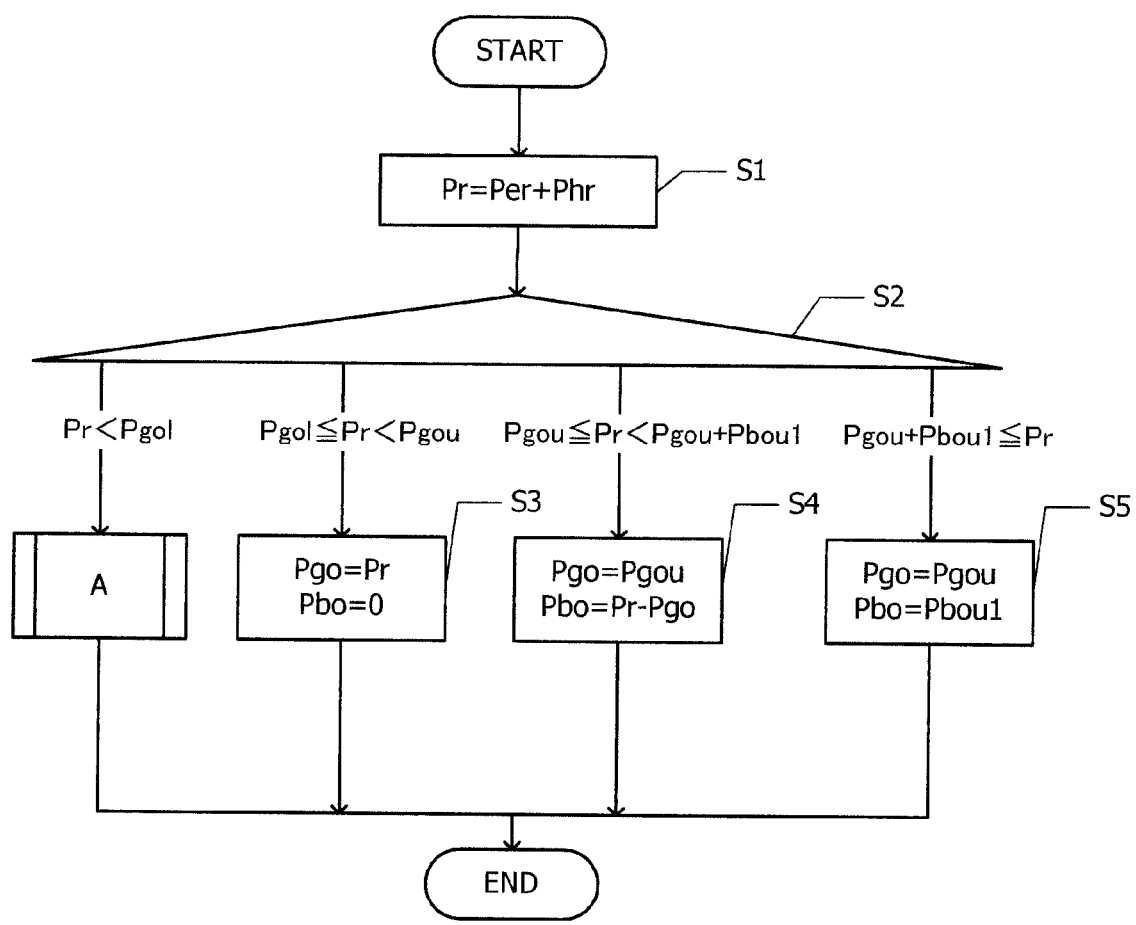
FIG. 21 is a flowchart of a power distribution process according to embodiment 7.
Figure 22:
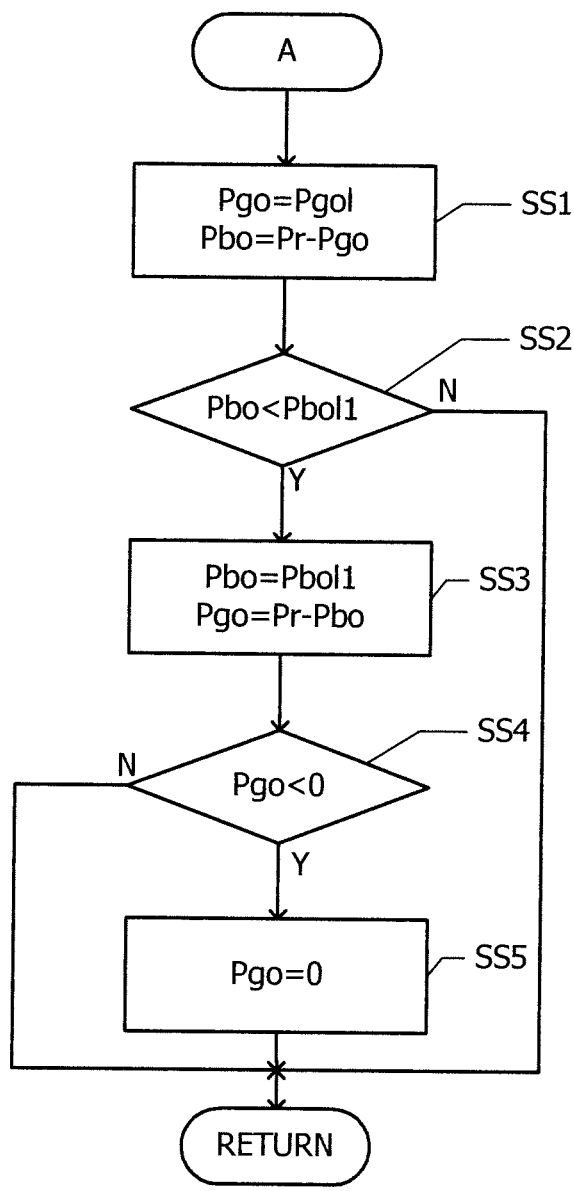
FIG. 22 is a flowchart of a process A of a power distribution process according to embodiment 7.
Figure 23:
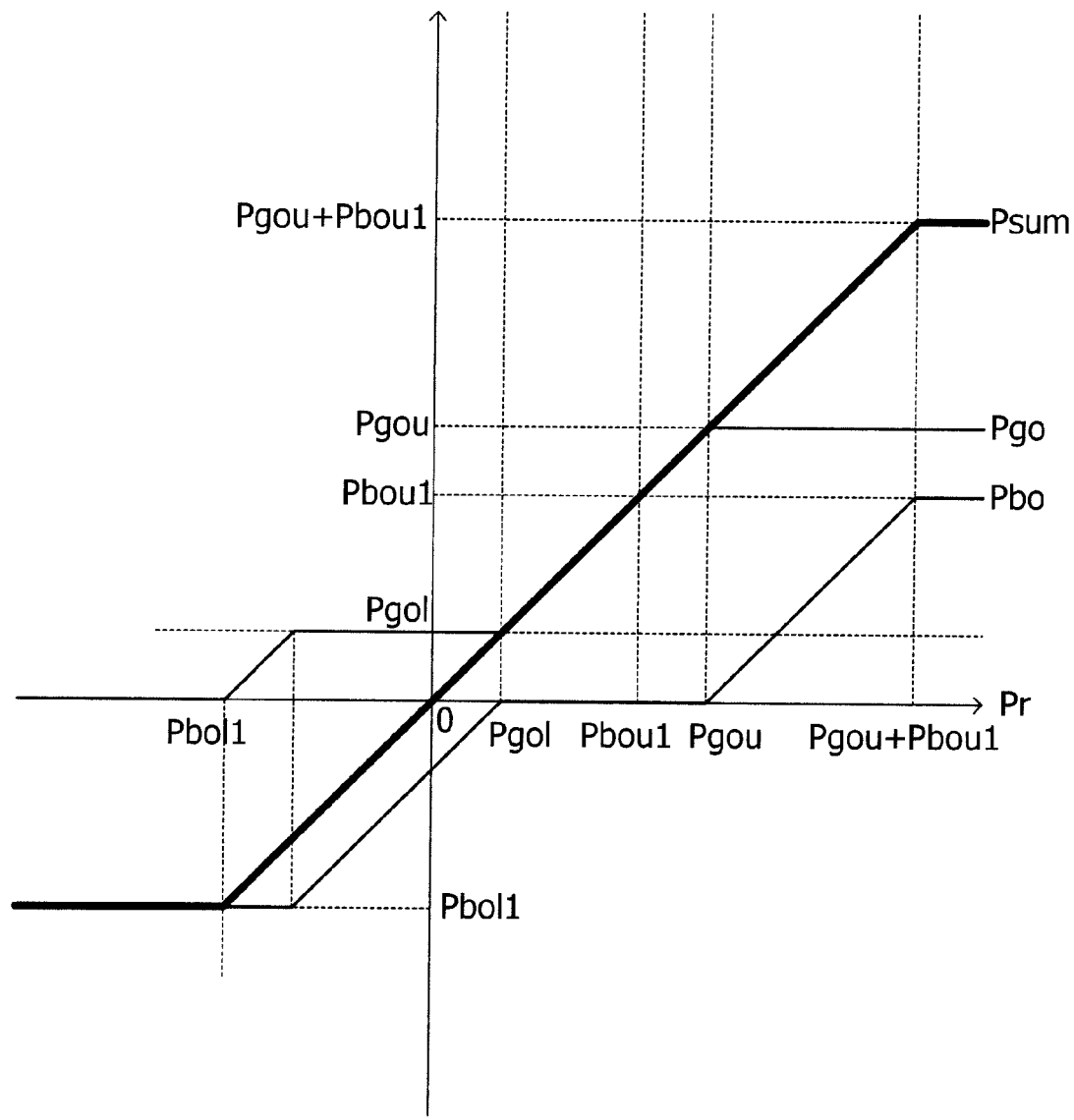
FIG. 23 is a graph showing the relationship between a sum of requirement output values and an output after distribution when a power distribution process according to embodiment 7 is applied.

Next, referring to FIGS. 21 to 23, embodiment 7 will be described. In embodiment 7, another example of processing of the power distribution block 35 illustrated in FIG. 10B will be described. FIG. 21 is a flowchart of a power distribution method according to embodiment 7, and FIG. 22 is a detailed flowchart of a process A illustrated in FIG. 21. FIG. 23 shows the relationship between a required output and an output after distribution. The sum of the engine output Pgo and the capacitor output Pbo is indicated as the output sum value Psum.

As illustrated in FIG. 21, in step S1, the sum value of the hydraulic load requirement output Phr and the swing motor requirement output Per is considered as the requirement output Pr. The requirement output Pr indicates the output requirement value of the sum of the mechanical power and electric power.

In step S2, processes are branched by the requirement output Pr. If the requirement output Pr is lower than the engine output lower limit value Pgol, a process A is performed. The process A will be described later with reference to FIG. 22.

If the requirement output Pr is equal to or larger than the engine output lower limit value Pgol and is smaller than the engine output upper limit value Pgou, step S3 is executed. In step S3, as illustrated in FIG. 23, the engine output Pgo is made to be equal to the requirement output Pr and the capacitor output Pbo is made to be equal to "0". That is, all requirement outputs Pr relies on the engine 11.

If the requirement output Pr is equal to or larger than the engine output upper limit value Pgou, and is smaller than the sum value of the engine output upper limit value Pgou and the second capacitor output upper limit value Pgou1, step S4 is executed. In step S4, as illustrated in FIG. 23, the engine output Pgo is made to be equal to the engine output upper limit value Pgou, and the capacitor output Pbo is made to be equal to a value obtained by subtracting the engine output Pgo from the requirement output Pr. That is, the engine 11 is operated with the output upper limit value, and the short amount of the power is extracted from the capacitor 19.

If the requirement output Pr is equal to or larger than the sum value of the engine output upper limit value Pgou and the second capacitor output upper limit value Pbou1, step S5 is executed. In step S5, as illustrated in FIG. 23, the engine output Pgo is made to be equal to the engine output upper limit value Pgou, and the capacitor output Pbo is made to be equal to the second capacitor output upper limit value Pbou1. That is, the power that corresponds to the output upper limit value is extracted from the engine 11 and the capacitor 19. At this time, the actual sum output Psum becomes smaller than the requirement output Pr.

FIG. 22 is a flowchart of a process A. In step SS1, as illustrated in FIG. 23, the engine output Pgo is made to be equal to the engine output lower limit value Pgol, and the capacitor output Pbo is made to be equal to the value that is obtained by subtracting the engine output Pgo from the requirement output Pr. That is, the engine 11 is operated with the output lower limit value Pgol, and the capacitor 19 is charged with the surplus mechanical power.

In step SS2, the capacitor output Pbo and the second capacitor output lower limit value Pbol1 are compared with each other. If the capacitor output Pbo is equal to or larger than the second capacitor output lower limit value Pbol1, the process A is finished, and the process returns to the flowchart of FIG. 21. That is, if the charge power of the capacitor 19 is equal to or smaller than its allowable upper limit value, the engine 11 is operated with the output lower limit value Pgol, and the capacitor 19 is charged with the surplus mechanical power.

If the capacitor output Pbo is smaller than the second capacitor output lower limit value Pbol1, the step SS3 is executed. In step SS3, as illustrated in FIG. 23, the capacitor output Pbo is made to be equal to the second capacitor output lower limit value Pbol1, That is, the charging power of the capacitor 19 is prevented from exceeding the allowable upper limit value. Further, the engine output Pgo is made to be equal to the value that is obtained by subtracting the capacitor output Pbo from the requirement output Pr. Even if the engine 11 is operated with its output lower limit value Pgol, part of the mechanical power generated by the engine 11 is not efficiently used as the charging power of the capacitor 19. Accordingly, the engine 11 is operated with the value that is equal to or smaller than the output lower limit value Pgol.

In step SS4, it is determined whether the engine output Pgo is negative or not negative. When the engine output Pgo is positive or "0", the process A is finished, and the process returns to the flowchart as illustrated in FIG. 21. If the engine output Pgo is negative, in step SS5, the engine output Pgo is set to "0". This is because it is not possible to control the engine 11 so that the engine output Pgo becomes negative. Thereafter, the process returns to the flowchart illustrated in FIG. 21.

The process of the power distribution block 35 is not limited to the method according to embodiment 6 and embodiment 7. In addition, diverse power distribution processes may be applied.

Although the invention has been described according to the embodiments thereof, the invention is not limited thereto. For example, it is apparent to those skilled in the art that diverse modifications, alterations, and combinations thereof can be made.

EXPLANATION OF REFERENCE

1: LOWER DRIVING STRUCTURE
1A, 1B: HYDRAULIC MOTOR
2: SWING MECHANISM
3: UPPER SWING STRUCTURE
4: BOOM
5: ARM
6: BUCKET
7: BOOM CYLINDER

8: ARM CYLINDER
9: BUCKET CYLINDER
10: CABIN
11: ENGINE
12: MOTOR GENERATOR
13: SPEED REDUCER
14: MAIN PUMP
15: PILOT PUMP
16: HIGH-PRESSURE HYDRAULIC LINE
17: CONTROL VALVE
18: INVERTER
19: CAPACITOR
21: SWING MOTOR (LOAD MOTOR)
22: RESOLVER
23: MECHANICAL BRAKE
24: SPEED REDUCER
25: PILOT LINE
26: OPERATION DEVICE
27, 28: HYDRAULIC LINE
29: PRESSURE SENSOR
30: CONTROLLER
31: OPERATION STATE STORAGE REGION
32: ENGINE OUTPUT RANGE DECISION BLOCK
33: CAPACITOR OUTPUT DECISION BLOCK
34: CORRECTION BLOCK
35: POWER DISTRIBUTION BLOCK
36: CAPACITOR DETERIORATION INFORMATION DETERMINATION BLOCK
45: DISPLAY DEVICE
90: ELECTRIC STORAGE CIRCUIT
100: CONVERTER
102A: BOOST IGBT
102B: BUCK IGBT
102$a$, 102$b$: DIODE
103A, 103$b$: POWER CONNECTION TERMINAL
104A, 104B: OUTPUT TERMINAL
105: SMOOTHING CONDENSER
106: CAPACITOR VOLTMETER
107: CAPACITOR AMMETER
110: DC BUS LINE
111: DC BUS VOLTMETER

What is claimed is:

1. A hybrid working machine comprising:
a capacitor;
a motor generator operating as a generator and a motor;
a converter capable of switching a discharge state where power is supplied from the capacitor to the motor generator and a charge state where the capacitor is charged by the power generated from the motor generator, and controlling electric power that is output from the capacitor in the discharge state and electric power that is input to the capacitor in the charge state;
a capacitor voltmeter measuring a terminal-terminal voltage of the capacitor;
a capacitor ammeter measuring charge/discharge current of the capacitor; and
a controller receiving a measurement result from the capacitor voltmeter and the capacitor ammeter, and controlling the converter based on the measurement result,
wherein the controller determines an appropriate range of the input/output power of the capacitor based on the measurement result by the capacitor voltmeter and the capacitor ammeter, and controls the converter so that the input/output power of the capacitor does not depart from the appropriate range, and
wherein the controller determines a mechanical power to be generated by the motor generator so that the input/output power of the capacitor does not depart from the appropriate range based on a requirement output of the motor generator, and controls the motor generator to output the determined mechanical power.

2. The hybrid working machine according to claim 1, wherein the controller calculates internal resistance of the capacitor based on the measurement result received from the capacitor voltmeter and the capacitor ammeter, and determines the appropriate range based on the calculated internal resistance.

3. The hybrid working machine according to claim 1, wherein the controller calculates capacitance of the capacitor based on the measurement result received from the capacitor voltmeter and the capacitor ammeter, and determines the appropriate range based on the calculated capacitance.

4. The hybrid working machine according to claim 1, wherein the motor generator is capable of performing power running for converting electric power discharged from the capacitor into mechanical power to output the mechanical power and a regenerative running for converting the mechanical power into the electric power.

5. The hybrid working machine according to claim 1, wherein the controller determines whether the operation state is a normal state or an output limiting state based on the measurement result received from the capacitor voltmeter and the capacitor ammeter, and controls the converter so that an absolute value of the input/output power of the capacitor in the case where the operation state is determined to be the output limiting state becomes equal to or smaller than an absolute value of the input/output power of the capacitor in the case where the operation state is determined to be the normal state.

6. The hybrid working machine according to claim 1, wherein the controller stores information that indicates transient characteristics of an internal resistance of the capacitor when starting to apply current to the capacitor, and determines the appropriate range of the input/output power of the capacitor based on the transient characteristics.

7. A hybrid working machine comprising:
a capacitor;
a motor generator operating as a generator and a motor;
a converter capable of switching a discharge state where power is supplied from the capacitor to the motor generator and a charge state where the capacitor is charged by the power generated from the motor generator, and controlling electric power that is output from the capacitor in the discharge state and electric power that is input to the capacitor in the charge state;
a capacitor voltmeter measuring a terminal-terminal voltage of the capacitor;
a capacitor ammeter measuring charge/discharge current of the capacitor;
a controller receiving a measurement result from the capacitor voltmeter and the capacitor ammeter, and controlling the converter based on the measurement result;
an engine providing mechanical power to the motor generator; and
a hydraulic pump receiving the mechanical power from the engine and the motor generator and generating hydraulic pressure,
wherein the controller determines an appropriate range of the output of the engine, and determines the mechanical power to be generated by the hydraulic pump based on the hydraulic load requirement output that is required for the hydraulic pump so that the input/output power of the capacitor does not depart from an appropriate range thereof and the output of the engine does not depart from the appropriate range of the output of the engine.

8. The hybrid working machine according to claim 7, wherein the controller calculates internal resistance of the capacitor based on the measurement result received from the capacitor voltmeter and the capacitor ammeter, and determines the appropriate range based on the calculated internal resistance.

9. The hybrid working machine according to claim 7, wherein the controller calculates capacitance of the capacitor based on the measurement result received from the capacitor voltmeter and the capacitor ammeter, and determines the appropriate range based on the calculated capacitance.

10. The hybrid working machine according to claim 7, wherein the controller determines whether the operation state is a normal state or an output limiting state based on the measurement result received from the capacitor voltmeter and the capacitor ammeter, and controls the converter so that an absolute value of the input/output power of the capacitor in the case where the operation state is determined to be the output limiting state becomes equal to or smaller than an absolute value of the input/output power of the capacitor in the case where the operation state is determined to be the normal state.

11. The hybrid working machine according to claim 7, wherein the controller stores information that indicates transient characteristics of an internal resistance of the capacitor when starting to apply current to the capacitor, and determines the appropriate range of the input/output power of the capacitor based on the transient characteristics.

12. A hybrid working machine comprising:
a capacitor;
a motor generator operating as a generator and a motor;
a converter capable of switching a discharge state where power is supplied from the capacitor to the motor generator and a charge state where the capacitor is charged by the power generated from the motor generator, and controlling electric power that is output from the capacitor in the discharge state and electric power that is input to the capacitor in the charge state;
a capacitor voltmeter measuring a terminal-terminal voltage of the capacitor;
a capacitor ammeter measuring charge/discharge current of the capacitor; and
a controller receiving the measurement result from the capacitor voltmeter and the capacitor ammeter, and controlling the converter,
wherein the controller controls the converter in a normal state where the converter is controlled so that the input/output power of the capacitor falls within a first range or in an output limiting state where the converter is controlled so that the input/output power of the capacitor falls within a second range that is narrower than the first range, and performs switching of the normal state and the output limiting state based on the measurement result.

13. The hybrid working machine according to claim 12, wherein the controller calculates internal resistance of the capacitor based on the measurement result received from the capacitor voltmeter and the capacitor ammeter, and determines the appropriate range based on the calculated internal resistance.

14. The hybrid working machine according to claim 12, wherein the controller calculates capacitance of the capacitor based on the measurement result received from the capacitor voltmeter and the capacitor ammeter, and determines the appropriate range based on the calculated capacitance.

15. The hybrid working machine according to claim 12, wherein the controller determines whether the operation state is a normal state or an output limiting state based on the measurement result received from the capacitor voltmeter and the capacitor ammeter, and controls the converter so that an absolute value of the input/output power of the capacitor in the case where the operation state is determined to be the output limiting state becomes equal to or smaller than an absolute value of the input/output power of the capacitor in the case where the operation state is determined to be the normal state.

16. The hybrid working machine according to claim 12, wherein the controller stores information that indicates transient characteristics of an internal resistance of the capacitor when starting to apply current to the capacitor, and determines the appropriate range of the input/output power of the capacitor based on the transient characteristics.

* * * * *